(12) United States Patent
Anderson et al.

(10) Patent No.: US 9,929,152 B2
(45) Date of Patent: Mar. 27, 2018

(54) VERTICAL TRANSISTORS AND METHODS OF FORMING SAME

(71) Applicant: GLOBALFOUNDRIES INC., Grand Cayman (KY)

(72) Inventors: Brent A. Anderson, Jericho, VT (US); Edward J. Nowak, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 33 days.

(21) Appl. No.: 15/198,309

(22) Filed: Jun. 30, 2016

(65) Prior Publication Data

US 2018/0006024 A1   Jan. 4, 2018

(51) Int. Cl.
*H01L 27/088* (2006.01)
*H01L 21/8234* (2006.01)

(52) U.S. Cl.
CPC .... *H01L 27/088* (2013.01); *H01L 21/823468* (2013.01); *H01L 21/823487* (2013.01)

(58) Field of Classification Search
CPC .......... H01L 27/088; H01L 21/823487; H01L 21/823468
See application file for complete search history.

(56) References Cited

U.S. PATENT DOCUMENTS

| 7,348,628 | B2 | 3/2008 | Yoon et al. |
| 8,742,495 | B2 | 6/2014 | Parthasarathy et al. |
| 2010/0308403 | A1 | 12/2010 | Jang et al. |

*Primary Examiner* — Hrayr A Sayadian
(74) *Attorney, Agent, or Firm* — Yuanmin Cai; Hoffman Warnick LLC

(57) ABSTRACT

One aspect of the disclosure relates to an integrated circuit structure. The integrated circuit structure may include a fin having a first source/drain region and a second source/drain, the first source/drain region being over a substrate and below a central region of the fin, and the second source/drain region being within a dielectric layer and over the central region of the fin; a gate structure within the dielectric layer substantially surrounding the central region of the fin between the first source/drain region and the second source drain region, wherein the fin includes at least one tapered region from the central region of the fin to at least one of the first source/drain region or the second source/drain region.

7 Claims, 32 Drawing Sheets

VERTICAL TRANSISTORS AND METHODS OF FORMING SAME

BACKGROUND

Technical Field

The present disclosure relates to an integrated circuit structure, and more particularly, to vertical transistors and methods of forming the same.

Related Art

Advanced manufacturing of integrated circuits requires formation of individual circuit elements, e.g., transistors such as field-effect-transistors (FETs), and the like based on specific circuit designs. A FET generally includes source, drain, and gate terminals. The gate terminal is placed between the source and drain terminals and controls the current between the source and drain terminals. Transistors may be formed over a substrate and may be electrically isolated with an insulating dielectric layer, e.g., inter-level dielectric layer. Contacts may be formed to each of the source, drain, and gate terminals through the dielectric layer in order to provide electrical connection between the transistors and other circuit elements that may be formed subsequent to the transistor in other metal levels.

Conventionally, FETs are horizontal transistors wherein the source and drain terminals are adjacent to one other on or within the substrate, and the gate terminal is disposed laterally between the source and drain terminals over the substrate. However, vertical transistors have recently become of interest in the field. Vertical transistors differ from conventional FETs in that one of the source and/or drain terminals is located above the other source and/or drain terminals with the gate terminal vertically therebetween.

SUMMARY

A first aspect of the disclosure provides for a method of forming a vertical transistor. The method may include: forming a first dielectric layer over a substrate and adjacent to a fin that is disposed over the substrate; oxidizing sidewalls of the fin to form an oxidized portion of the fin at the sidewalls at a central region of the fin; removing the oxidized portion of the fin from the sidewalls at the central region of the fin, thereby forming at least one tapered region of the fin, wherein the at least one tapered region of the fin is formed above the central region or below the central region; forming a gate structure over the first dielectric layer and around at least a portion of the central region of the of the fin; removing the first dielectric layer to form voids directly adjacent to the fin in an area over the substrate and beneath the gate structure; growing a first epitaxial layer within the voids such that the first epitaxial layer is disposed substantially around the fin in the area over the substrate and beneath the gate structure; performing a first anneal to form a first source/drain region with the fin; growing a second epitaxial layer over a top surface of the fin; and performing a second anneal to form a second source/drain region within the fin, thereby creating the vertical transistor.

A second aspect of the disclosure provides for a method of forming a vertical transistor. The method may include: forming a pair of fins over a substrate, wherein each fin in the pair of fins includes a tapered sidewall on a side of the fin that faces another fin in the pair of fins; forming a first dielectric layer over the substrate and adjacent to each fin; forming a gate structure over the first dielectric layer and around each fin of the pair of fins; removing the first dielectric layer such that voids are created adjacent to each fin in an area over the substrate and beneath the gate structure; growing a first epitaxial layer within the voids such that the first epitaxial layer is disposed substantially around each fin in the area over the substrate and beneath the gate structure; performing a first anneal to form a first source/drain region within each fin; growing a second epitaxial layer over a top surface of each fin; and performing a second anneal to form a second source/drain region within each fin, thereby creating the vertical transistor.

A third aspect of the disclosure provides for a vertical transistor. The vertical transistor may include: a fin having a first source/drain region and a second source/drain, the first source/drain region being over a substrate and below a central region of the fin, and the second source/drain region being within an inter-level dielectric (ILD) layer and over the central region of the fin; and a gate structure within the dielectric layer substantially surrounding the central region of the fin between the first source/drain region and the second source/drain region, wherein the fin includes at least one tapered region from the central region of the fin to at least one of the first source/drain region or the second source/drain region.

A fourth aspect of the disclosure provides for a vertical transistor. The vertical transistor may include: a pair of fins over a substrate; a gate structure within an inter-level dielectric (ILD) layer substantially surrounding each fin in the pair of fins; a first source/drain region within each fin below the gate structure; a second source/drain region with each fin over the gate structure, wherein each fin in the pair of fins includes a tapered sidewall on a side of the fin that faces the another fin in the pair of fins.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1-18 show cross-sectional views of an integrated circuit structure being processed in a method according to an embodiment of the disclosure, wherein FIG. 18 shows a resulting integrated circuit structure.

FIGS. 19-32 show cross-sectional views of an integrated circuit structure being processed in a method according to an embodiment of the disclosure, wherein FIG. 32 shows a resulting integrated circuit structure.

FIGS. 33-43 show cross-sectional views of an integrated circuit structure being processed in a method according to an embodiment of the disclosure, wherein FIG. 43 shows a resulting integrated circuit structure.

FIGS. 44-64 show a cross-sectional view of an integrated circuit structure undergoing aspects of a method according to an embodiment of the disclosure wherein FIG. 64 shows the resulting integrated circuit structure after the method according to this embodiment is performed.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
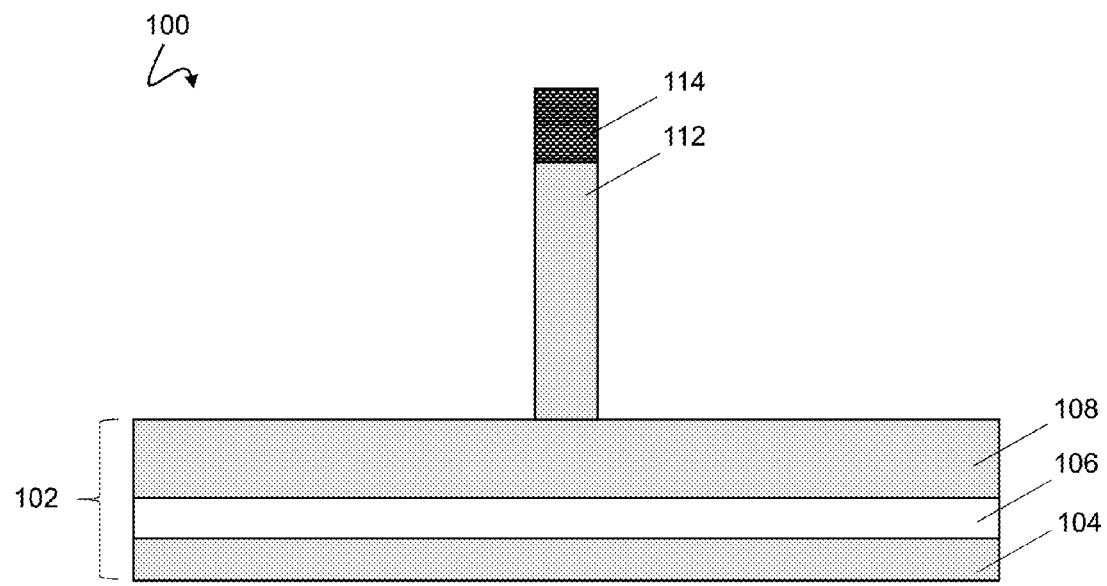

The present disclosure relates to an integrated circuit structure, and more particularly, to vertical transistors and methods of forming the same. Specifically, the present disclosure provides for vertical transistors with tapered regions such that a fin of the transistor may have a variable width throughout the vertical length of the fin. Such tapered regions allow for optimization of device resistance and device capacitance. More particularly, embodiments of the present disclosure include a vertical transistor with reduced device resistance without increasing device capacitance due to the variable width throughout the vertical length of the fin.

FIGS. 1-18 show a cross-sectional view of an integrated circuit structure undergoing aspects of a method according to an embodiment of the disclosure. Beginning with FIG. 1, a preliminary integrated circuit (IC) structure 100 is shown. IC structure 100 may include a substrate 102. As shown, substrate 102 may include a semiconductor-on-insulator (SOI) substrate. That is, substrate 102 may include a semiconductor layer 104, an insulator layer 106 overlying semiconductor layer 104, and another semiconductor layer 108 overlying insulator layer 104. Semiconductor layers 104, 108 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained. Insulator layer 106 may include for example, silicon oxide (BOX layer) or other inorganic dielectric materials. However, in other embodiments, it is to be understood that substrate 102 may include a bulk silicon substrate.

Substrate 102 may be formed by forming insulator layer 106 over semiconductor layer 104 and semiconductor layer 108 over buried insulator layer 106 such as by deposition or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Still referring to FIG. 1, a fin 112 may be formed from substrate 102. Fin 112 may be formed by forming a hard mask 114 over substrate 102, or more particularly, over semiconductor layer 108 of substrate 102, and patterning and etching hard mask 114 such that a portion of hard mask 114 remains over substrate 102 where fin 112 is desired to be formed. Subsequently, substrate may be etched such that the portion of substrate 102 that is covered or protected by hard mask 114 forms fin 112. Hard mask 114 may include silicon dioxide and/or silicon nitride, or any other hard mask material known in the art. While only a single fin, i.e., fin 112, has been shown, it is to be understood that any number of fins may be formed without departing from aspects of the disclosure. Additionally, the embodiments described herein are equally applicable to processing more than one fin.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Figure 2:
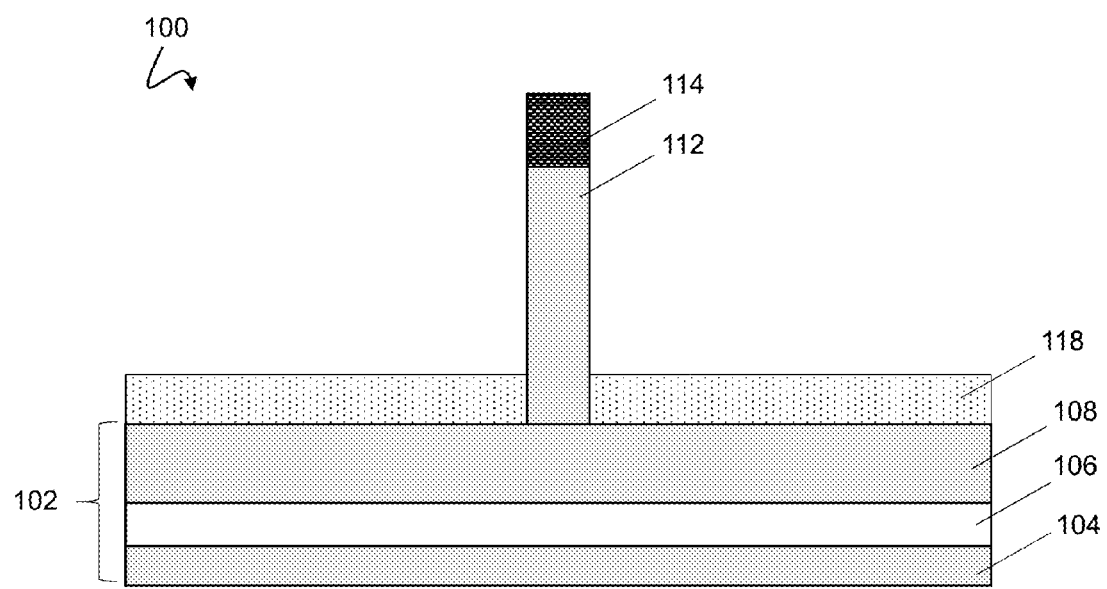

Referring now to FIG. 2, a dielectric layer 118 may be formed, e.g., deposited, over horizontal surfaces of substrate 102, or more particularly, semiconductor layer 108 of substrate 102. Portions of dielectric layer 118 may be formed directly laterally adjacent to fin 112 that is disposed over substrate 102. Dielectric layer 118 may be composed of any insulating material such as $SiO_2$ or a "high-k" dielectric having a high dielectric constant, which may be, for example, above 3.9. In some situations, dielectric layer 118 may be composed of an oxide substance. Materials appropriate for the composition of dielectric layer 118 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Figure 3:
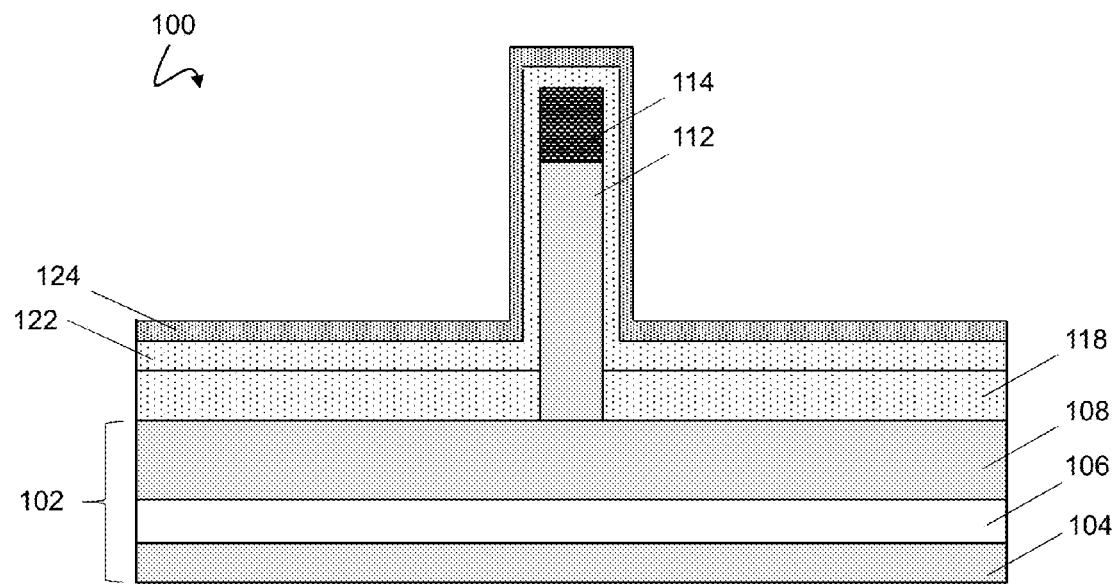

As shown in FIG. 3, an oxide layer 122 and a nitride layer 124 may be conformally deposited over dielectric layer 118 and fin 112 having hard mask 114 thereover. That is, oxide layer 122 and nitride layer 124 may be formed such that oxide layer 122 and nitride layer 124 substantially surround fin 112. As shown, oxide layer 122 may be formed over dielectric layer 118 and along a vertical length of fin 112. Nitride layer 124 may be formed over oxide layer 122 including along oxide layer 122 that is along a vertical length of fin 112. Oxide layer 122 may include any of the materials discussed relative to dielectric layer 118. Nitride layer 124 may include, for example, silicon nitride. As used herein, "substantially" refers to largely, for the most part, entirely specified or any slight deviation which provides the same technical benefits of the disclosure. For example, at most, approximately five percent of the exterior surface area of fin 112 may not have nitride and/or oxide layers 122, 124 thereon, yet fin 112 can remain substantially surrounded by oxide and/or nitride layers 122, 124.

Figure 4:
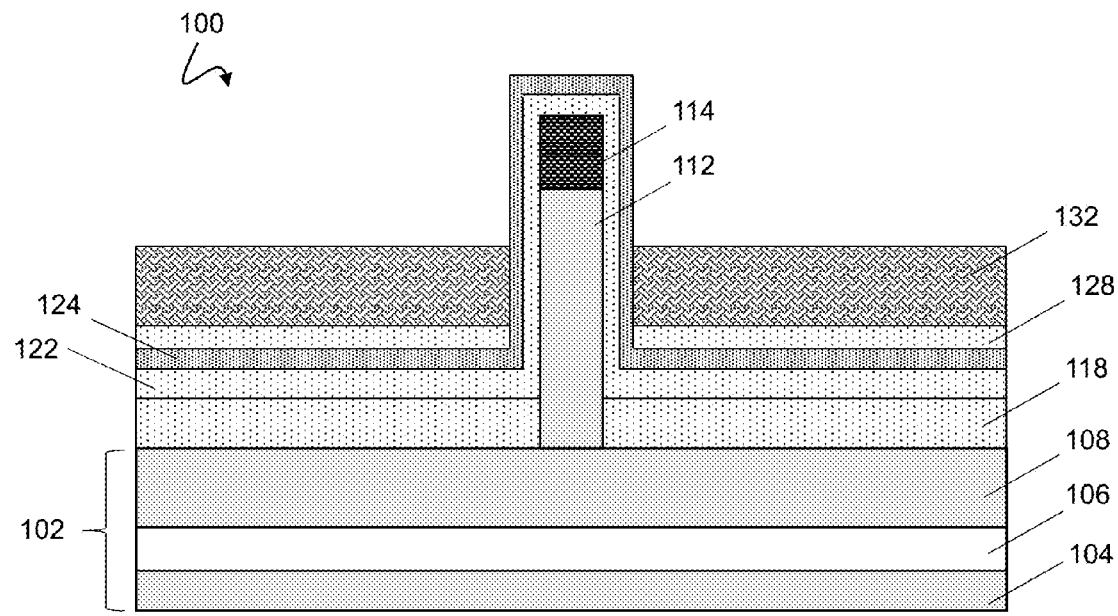

Referring now to FIG. 4, another dielectric layer 128 may be formed over nitride layer 124. Dielectric layer 128 may be formed on horizontal surfaces of nitride layer 124 that are adjacent to fin 112 such that a substantial portion of nitride layer 124 along the vertical length of fin 112 remains exposed. Dielectric layer 128 may include any of the materials discussed relative to dielectric layer 118. Additionally, a dummy gate layer 132 may be formed over dielectric layer 128 laterally adjacent to fin 112, and optionally separated from fin 112 by oxide and nitride layer 122, 124 positioned therebetween. As shown, dummy gate layer 132 may be formed adjacent to a portion of the exposed nitride layer 124 that is along a vertical length of fin 112. Dummy gate layer 132 may include any material conventionally used for dummy gates such as, for example, polycrystalline silicon (also known as polysilicon). As known in the art, a dummy gate material may be formed prior to the formation of an active gate so that the IC structure can undergo additional processing without harming the active gate. Once the desired processing of the IC structure is complete, the dummy gate material can be removed and replaced with an active gate, as discussed elsewhere herein.

Figure 5:
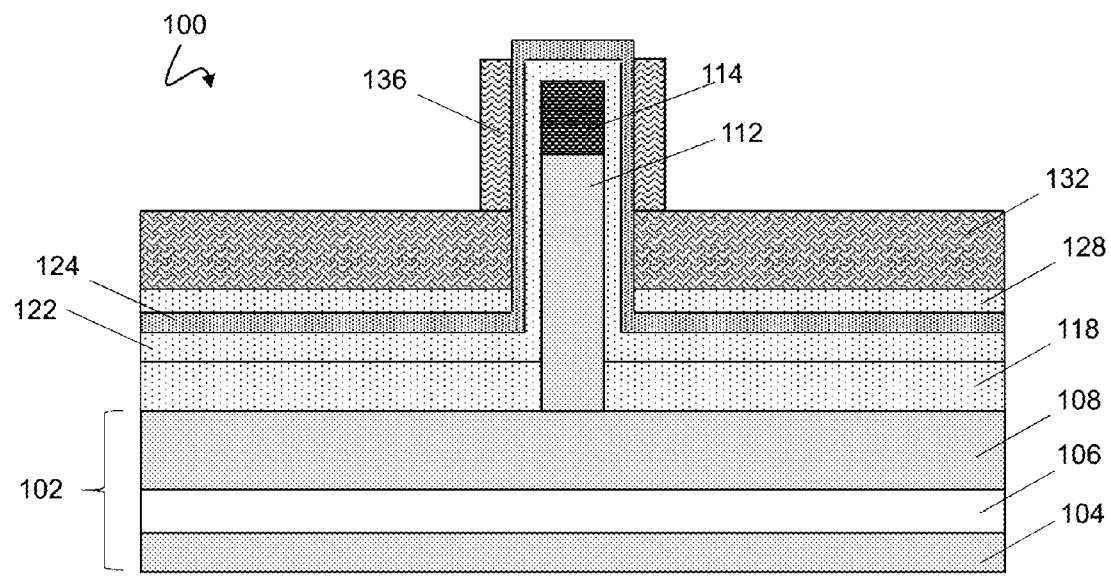
Figure 6:
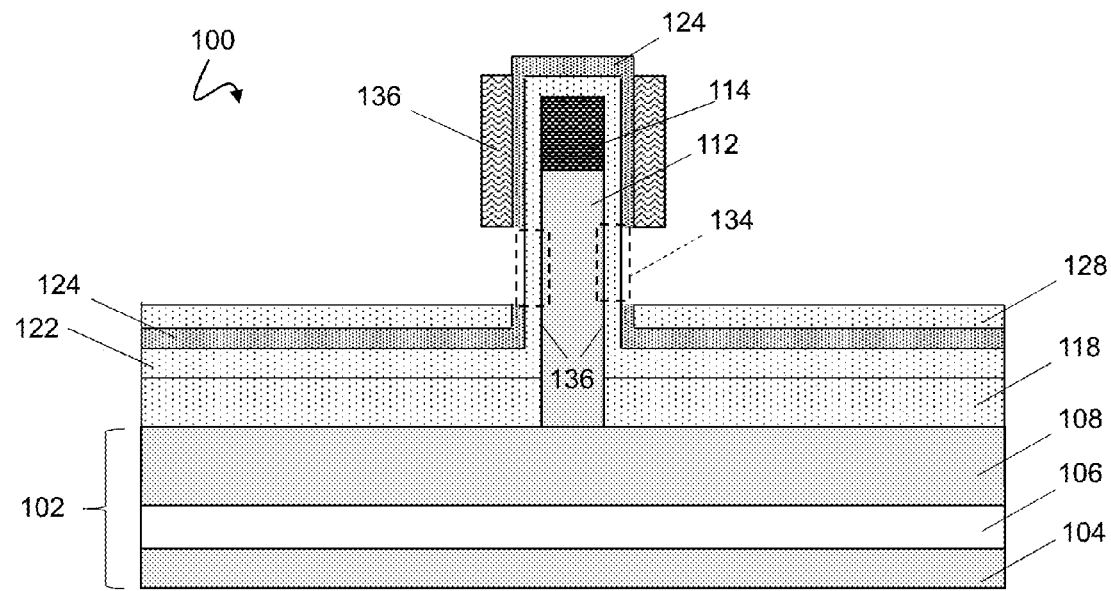

Referring now to FIG. 5, spacers 136 may be formed, e.g., by deposition and etching, over dummy gate layer 132 adjacent to fin 112, or more particularly, immediately adjacent to another portion of the exposed nitride layer 124 that is along the vertical length of fin 112. Spacers 136 may include any conventional spacer material, such as, for example, an oxide. As shown in FIG. 6, spacers 136 may act as a mask while IC structure 100 undergoes an etching to remove dummy gate layer 132. The etching may include anisotropic and/or isotropic etching. These processes may induce at most negligible etching of dielectric layer 128 and spacers 136. Removal of dummy gate layer 132 exposes dielectric layer 128 thereunder. Further, spacers 136 remain adjacent to portions of nitride layer 124 alongside a vertical portion of fin 112. Once dummy gate layer 132 is removed, a portion (not shown) of nitride layer 124 that is adjacent to fin 112 between spacers 136 and dielectric layer 128 is exposed. This portion of nitride layer 124 may be removed by isotropic etching. Isotropic etching of nitride layer 124 may be performed separately from any isotropic etching used to remove dummy gate layer 132. Alternatively, portions of nitride layer 124 may be removed at the same time that dummy gate layer 132 is removed. After any portions of nitride layer 124 are removed, a portion 134 (shown by phantom boxes) of oxide layer 122 can remain immediately adjacent to sidewalls 138 of fin 112. As shown, portion 134 of oxide layer 122 may be present below spacer 132 and above an exposed upper surface of dielectric layer 128.

Figure 7:
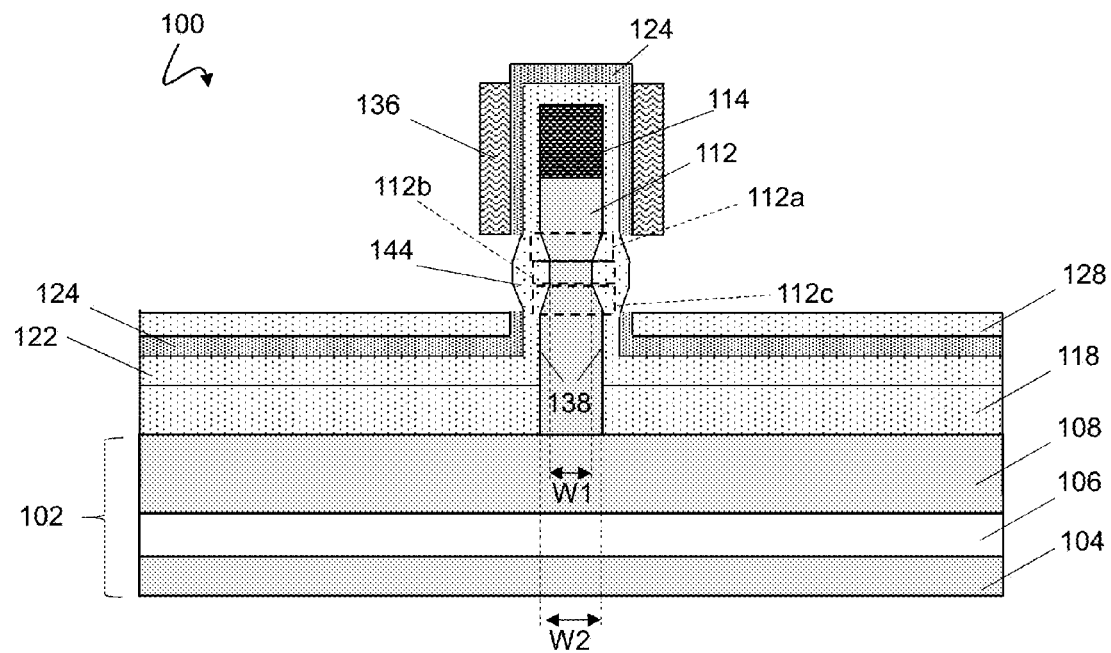

Referring now to FIG. 7, a thermal oxidation may be performed on IC structure 100 to oxidize sidewalls 138 of fin 112. The thermal oxidation may result in a portion of fin 112 at sidewalls 138 of fin 112 that is adjacent to portion 134 (FIG. 6) to become oxidized, thereby yielding an oxidized portion 144 of fin 112. In this way, the non-oxide material composition of fin 112 reacts with oxide layer 122 of portion 134 (FIG. 6) such that a portion of fin 112 becomes an oxide, e.g., silicon dioxide. The oxidation of IC structure 100, and more particularly, fin 112, may be controlled by altering the temperature and pressure of the oxidation until the desired amount of oxidation of fin 112 is performed. The temperature used during the oxidation process may include a temperature of, e.g., approximately 800° C. to approximately 1200° C. The pressure used during the oxidation process may include a pressure of, e.g., approximately 1 atmospheres to approximately 25 atmospheres. As used herein "approximately" is intended to include values, for example, within 10% of the stated values.

The controlled oxidation of fin 112 may result in fin 112 having a tapered region 112a above a central region 112b of fin 112 and another tapered region 112c below central region 112 of fin 112. As used herein, "central region" refers to a middle portion of the fin along the fin height. As shown, oxidation of fin 112 reduces a width W1 of fin 112 at central region 112b of fin 112. That is, width W1 at central region 112b of fin 112 is less than a width W2 of fin 112 at sidewalls 138 of portions of fin 112 that were not oxidized. Width W1 of fin 112 is reduced due to a portion of fin 112 at central region 112a being reacted with portion 134 (FIG. 6) of oxide layer 122. Additionally, as shown in FIG. 7, the oxidation results in tapered regions 112a, 112c being formed above and below central region 112b, respectively. Within the tapered regions 112a, 112c of fin 112, a width of fin 112 gradually expands away from central region 112b. That is, less of fin 112 is oxidized further from central region 112b due to oxide layer 122 at regions away from central region 112b being protected by other materials, e.g., nitride layer 124, spacers 136, etc.

Figure 8:
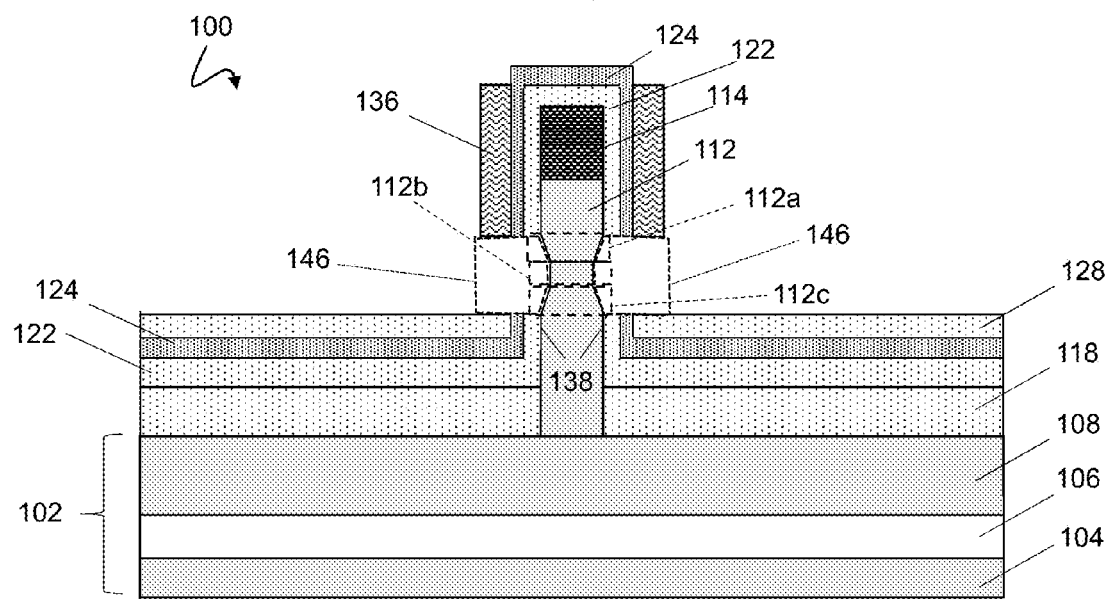

After oxidizing portions of fin 112 by a desired amount, oxidized portion(s) 144 (FIG. 7) may be selectively removed, e.g., by etching using dilute HF, from sidewalls 138 of fin 112 as show in FIG. 8 to create voids 146. Removing oxidized portion 144 results in fin 112 remaining over substrate with central region 112b and tapered regions 112a, 112c. Voids 146 expose central region 112b and tapered regions 112a, 112c of fin 112. Voids 146 may be formed on opposing sides of fin 112 and may be defined by a region beneath spacers 136, over dielectric layer 128, and adjacent to exposed central region 112b and tapered regions 112a, 112c of fin 112. While this process is targeted to selectively remove oxidized portion 144, it is to be understood that this selective removal process may also incidentally remove small portions of spacer 136 and dielectric layer 128.

Figure 9:
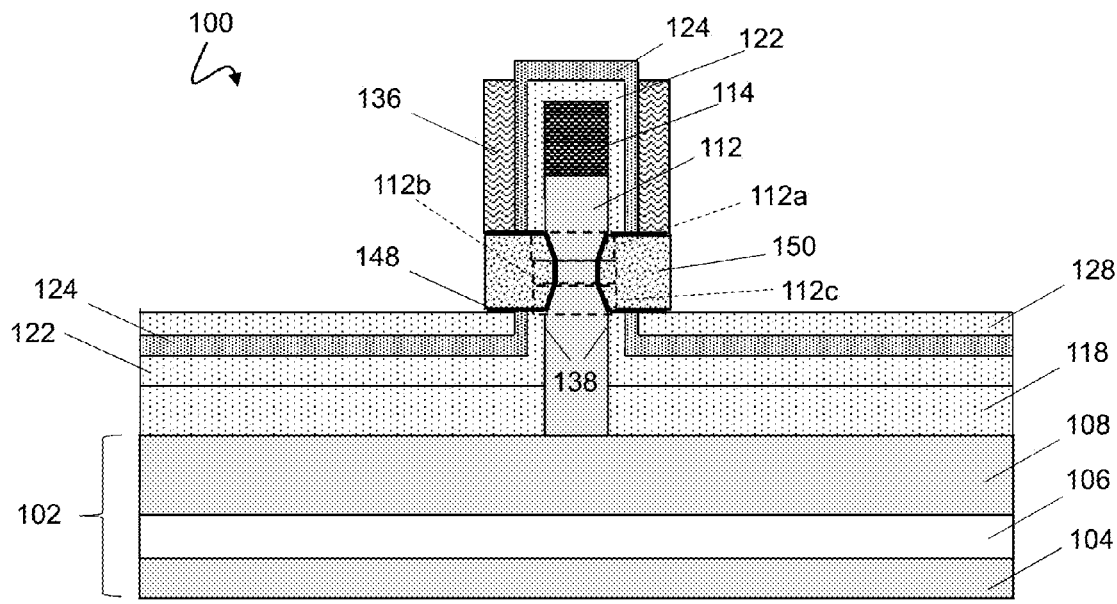

Referring now to FIG. 9, a gate dielectric 148 (represented by thick black line) and gate structure 150 may be formed. Gate dielectric 148 may be formed by conformally depositing gate dielectric 148 over IC structure 100 and etching gate dielectric 148 such that gate dielectric 148 substantially lines voids 146 (FIG. 8). After gate dielectric 148 is etched, gate structure 150 may be deposited and etched such that gate structure 150 is substantially surrounded by gate dielectric 148 and substantially fills voids 146. Gate dielectric 148 and gate structure 150 may be disposed over dielectric layers 118, 128, oxide layer 122, and nitride layer 124. Further, gate dielectric 148 and gate structure 150 may substantially surround at least central region 112b of fin. Gate dielectric 148 may include any conventional gate dielectric or other insulating materials described herein such as, for example, silicon dioxide. In some embodiments, gate structure 150 may include another dummy gate material. In such an embodiment, gate structure 150 may include any conventional dummy gate materials, such as, for example, polysilicon. In other embodiments, gate structure 150 may include an active gate structure. In such an embodiment, gate structure 150 may include conventional gate stack materials such as work function metals and conductors that may be chosen based on the desired application of gate structure 150.

Figure 10:
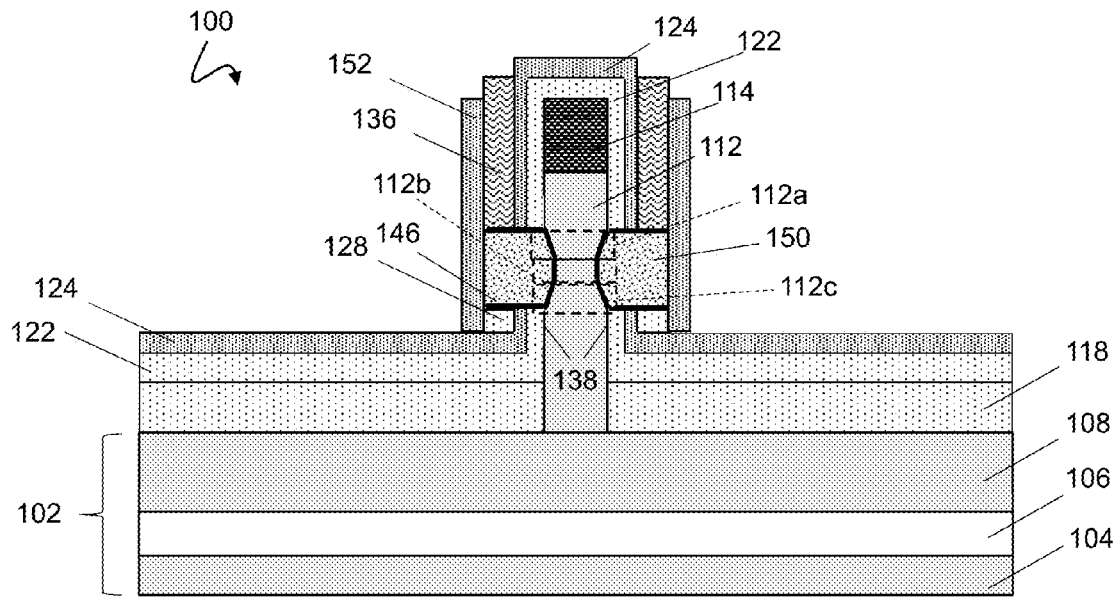

As shown in FIG. 10, a substantial portion of dielectric layer 128 may be removed, e.g., by anisotropically etching dielectric layer 128 to substantially expose nitride layer 124 thereunder. During this removal process, spacers 136 act as a mask. Therefore, a portion of dielectric layer 128 remains below spacers 136, or more particularly, below gate dielectric 148 that is directly over dielectric layer 128 and below spacers 136. Additionally, gate spacers 152 may be formed, e.g., by depositing and etching. That is, a gate spacer material may be deposited over the exposed nitride layer 124 to a desired thickness or height and etched such that a portion of the gate spacer material remains adjacent to fin 112 to form gate spacers 152. In another embodiment gate spacer material(s) can be formed immediately adjacent to gate structure 150, spacers 136, and the remaining portion of dielectric layer 128 below spacers 136 to create gate spacers 152. Gate spacers 152 may substantially surround gate structure 150 and extend along a substantial portion of the vertical length of fin 112. Gate spacers 152 may include, for example, a nitride such as silicon nitride. In other embodiments, gate spacers 152 may also include any conventional gate spacer materials such as hafnium silicate, hafnium oxide, zirconium silicate, zirconium oxide, silicon oxide, silicon oxynitride, high-k material or any combination of these materials.

Figure 11:
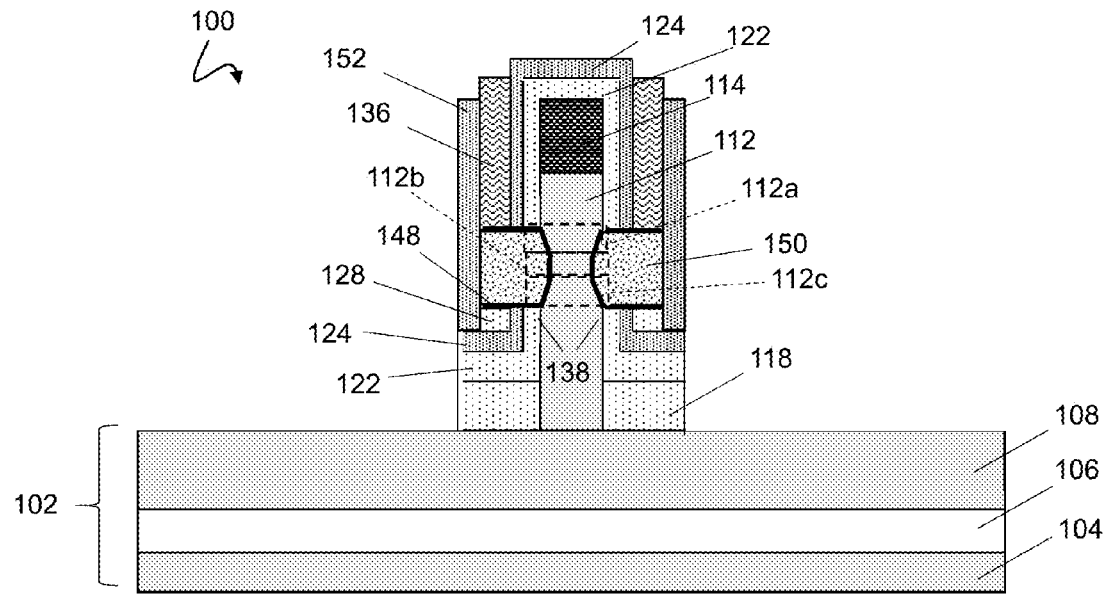
Figure 12:
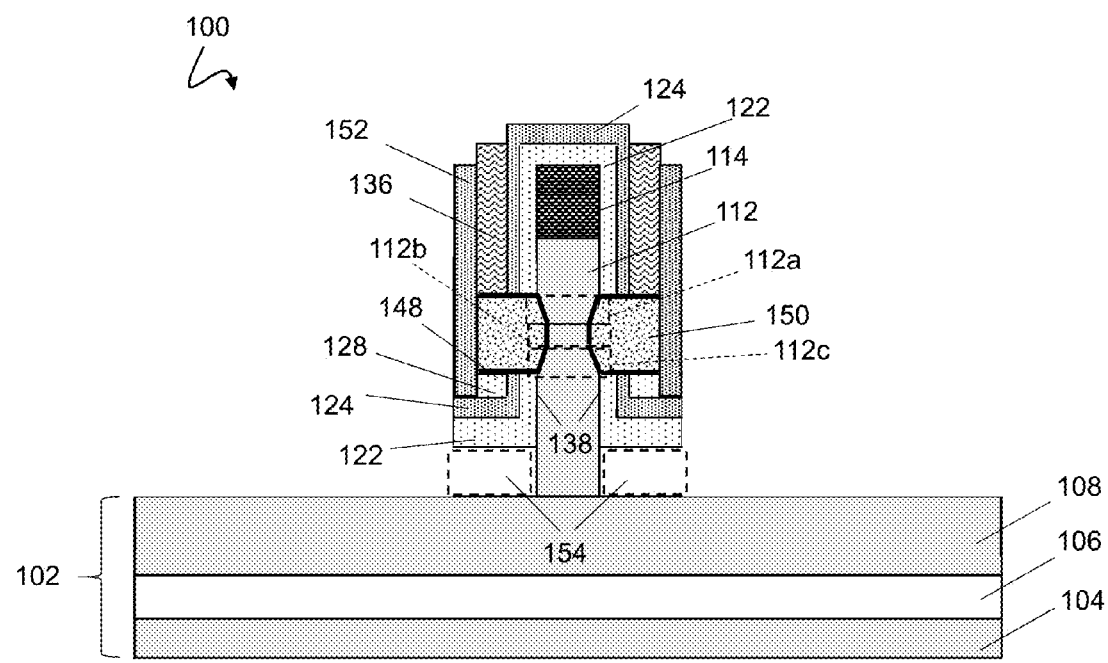

Referring now to FIG. 11, another etching, e.g., an anisotropic etch, may be performed to remove material adjacent to fin 112 from over substrate 102 such that material between substrate 102 and gate spacers 152 remain. That is, the etching may remove oxide layer 122, nitride layer 124, and dielectric layer 118 to expose substrate 102, or more particularly, semiconductor layer 108. During this etching, gate spacers 152 act as a mask such that any portions of oxide layer 122, nitride layer 124, and dielectric layer 118 beneath or protected by gate spacers 152 is not etched. Subsequently, an isotropic etch can be performed to remove any portion of dielectric layer 118 beneath gate spacers 152, as shown in FIG. 12. Since the etch is selective to dielectric layer 118, oxide layer 122 and nitride layer 124 substantially remain beneath gate spacers 152. The selective removal of dielectric layer 118 exposes a portion of fin 112 between central region 112b, while forming voids 154 on opposing sides of fin 112 and beneath remaining portions of oxide layer 122 that is protected by gate spacers 152. That is, voids 154 are created immediately adjacent to fin 112 in an area over substrate 102 and beneath gate structure 150.

Figure 13:
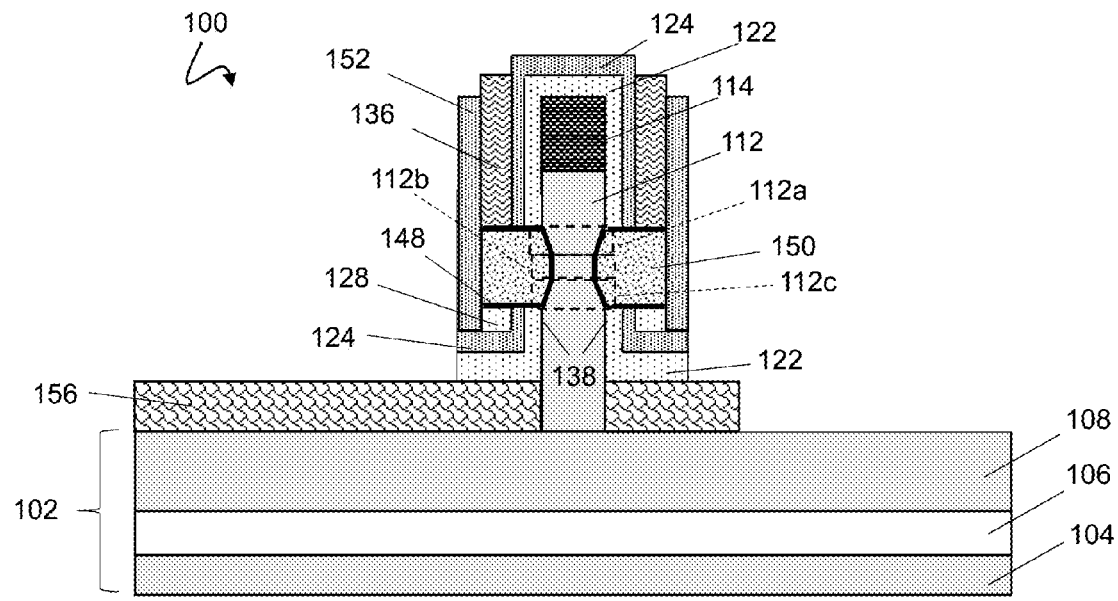

Referring now to FIG. 13, an epitaxially grown source/drain material (hereinafter, "epitaxial layer") 156 may be formed over substrate 102, or more particularly, over semiconductor layer 108 of substrate 102 to substantially fill voids 154. Epitaxial layer 156 may be optionally patterned to any desired configuration such that a portion of substrate 102 is exposed. Epitaxial layer 156 may be formed such that epitaxial layer 156 is within voids 154 and substantially surrounds fin 112 in an area over substrate 102 and beneath gate structure 150, or more particularly, beneath remaining portions of dielectric layer 128, nitride layer 124, and oxide layer 122 that are beneath gate structure 150. Epitaxial layer 156 may be grown below gate structure 150 from a portion of fin 112 below central region 112b of fin 112. Epitaxial layer 156 may include, for example, silicon, silicon germanium, or silicon carbon and may be doped with conventional n-type or p-type dopants. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 14:
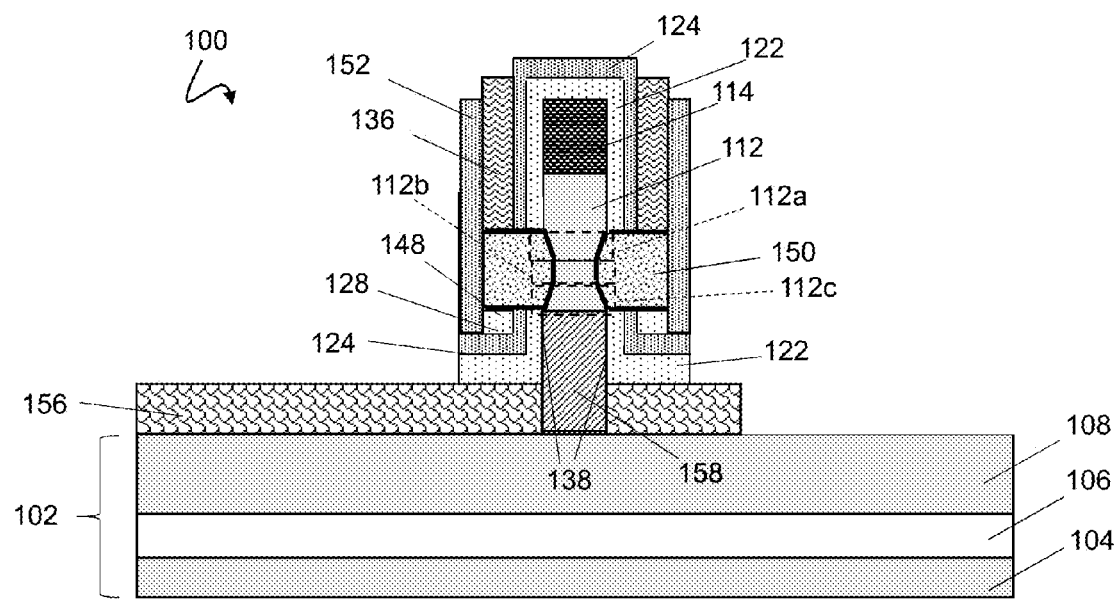
Figure 15:
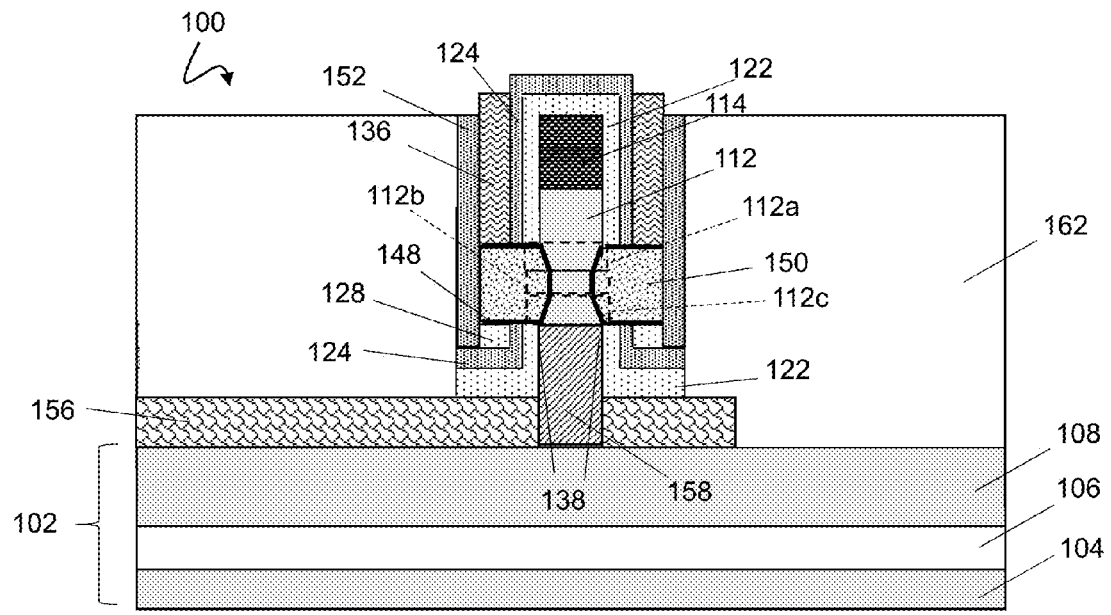

As shown in FIG. 14, epitaxial layer 156 can be annealed such that epitaxial layer 156 diffuses into a portion of fin 112 adjacent to epitaxial layer 156. The annealing may be performed such that epitaxial layer 156 diffuses to a point proximal to tapered region 112c. The diffusion causes a source/drain region 158 to be formed within fin 112. Referring now to FIG. 15, an inter-level dielectric (ILD) layer 162 may be formed on IC structure 100. More particularly, ILD layer 162 may be formed over substrate 102 and epitaxial layer 156 such that fin 112 is substantially within ILD layer 162. ILD layer 162 may be etched back or planarized to a top surface of gate spacers 152 such that a portion of nitride layer 124 and spacers 136 are exposed. ILD layer 162 may include any material conventionally used for an ILD layer, such as, for example, silicon nitride, silicon oxide, fluorinated silicon dioxide (FSG), hydrogenated silicon oxycarbide, porous silicon oxycarbide, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 16:
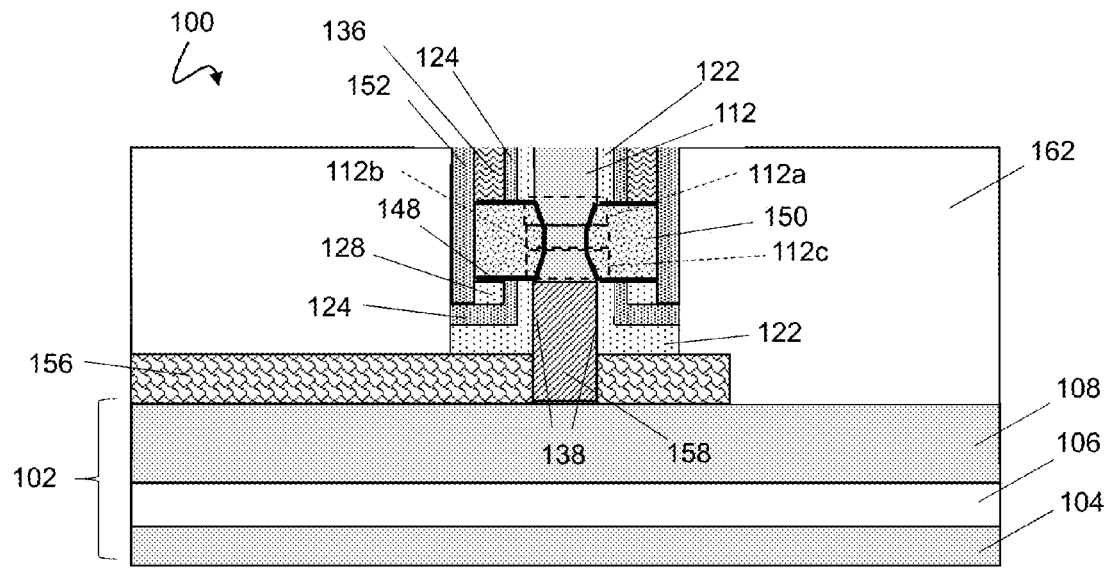
Figure 17:
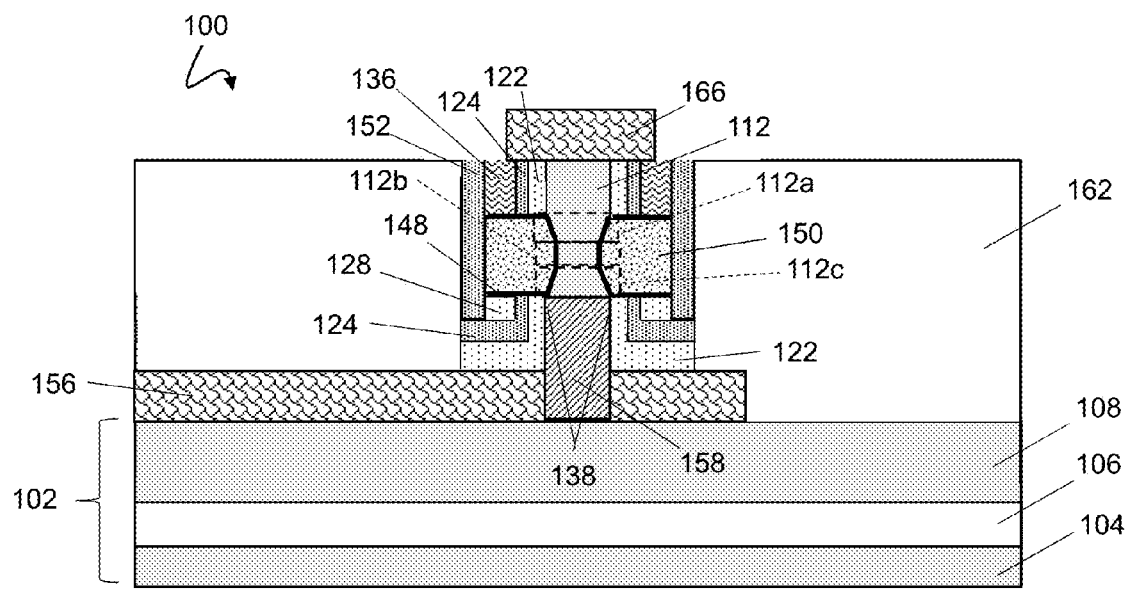

Referring now to FIG. 16, an etching or planarization technique may be performed to expose a top surface of fin 112. As shown, this etching may include removing portions of ILD layer 162, gate spacers 152, spacers 136, nitride layer 124, and oxide layer 122. After the top surface of fin 112 is exposed, epitaxial layer 166 may be formed, e.g., grown, such that epitaxial layer 166 contacts a top surface of fin 112 as shown in FIG. 17. Epitaxial layer 166 may include any of the example materials listed herein for epitaxial layer 156. Epitaxial layer may 166 be patterned and etched to any desirable configuration to optionally expose portions of dielectric layer 162, gate spacers 152, spacers 136, nitride layer 124, and/or oxide layer 122.

Figure 18:
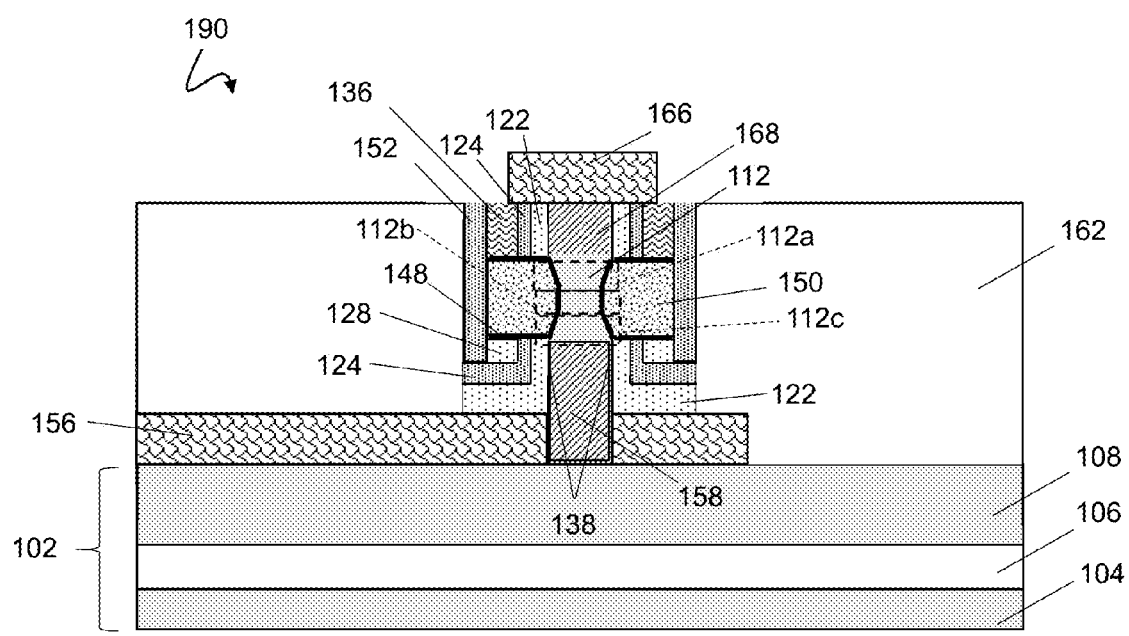

Referring now to FIG. 18, another anneal may be performed such that epitaxial layer 166 diffuses into a portion of fin 112 adjacent to epitaxial layer 166. The anneal may be performed such that epitaxial layer 166 diffuses to a point proximal to tapered region 112a. The diffusion causes a source/drain region 168 to be formed within fin 112.

The resulting IC structure shown in FIG. 18 may embody a vertical transistor 190. Vertical transistor 190 may include fin 112 having source/drain region 158 and second source/drain region 168. Source/drain region 158 may be positioned over substrate 102 and below central region 112b of fin 112, and source/drain region 168 may be within ILD layer 162 and over central region 112b of fin 112. Gate structure 150 may be disposed within ILD layer 162 between source/drain region 158 and source/drain region 168. Additionally, gate structure 150 may substantially surround central region 112b and tapered regions 112a, 112c of fin 112. Gate spacers 152 may substantially surround gate structure 150. Gate spacers 152 may extend from a top surface of a horizontal portion of nitride layer 124 to a top surface of ILD layer 162. Fin 112 may also include at least one tapered region 112a, 112c from central region 112b of fin 112 to at least one of source/drain region 158 or source/drain region 168. In some embodiments (shown), vertical transistor 190 may include tapered region 112c to source/drain region 158 and tapered region 112a to source/drain region 168. Vertical transistor 190 may also include epitaxial layer 156 over substrate 102 within ILD layer 162 and substantially surrounding source/drain region 158. Further, epitaxial layer 158 may be disposed over source/drain region 168 and over ILD layer 162.

Oxide layer 122 may be disposed over epitaxial layer 156 in an area between epitaxial layer 156 and gate structure 150. Within the same area, nitride layer 124 may be disposed over oxide layer 122, and dielectric layer 128 may be disposed over a portion of nitride layer 124. Gate dielectric 148 may substantially separate oxide layer 122, dielectric layer 128, and nitride layer 124 from gate structure 150. A portion of oxide layer 122 may be disposed adjacent to, and substantially surround, source/drain region 168 of fin 112 in an area above gate structure 150 and below epitaxial layer 166. Further, on a side of oxide layer 122 that is opposite source/drain region 168, nitride layer 124 may be disposed. Nitride layer 124 may be disposed between gate structure 150 and second epitaxial layer 168. Gate dielectric 148 may substantially separate oxide layer 122, nitride layer 124, and spacers 136 from gate structure 150. Additionally, spacers 136 may be disposed adjacent to nitride layer 124 above gate structure 150 on a side of nitride layer 124 that is opposite oxide layer 122. In this way, spacers 136 may be adjacent to gate spacers 152.

Figure 19:
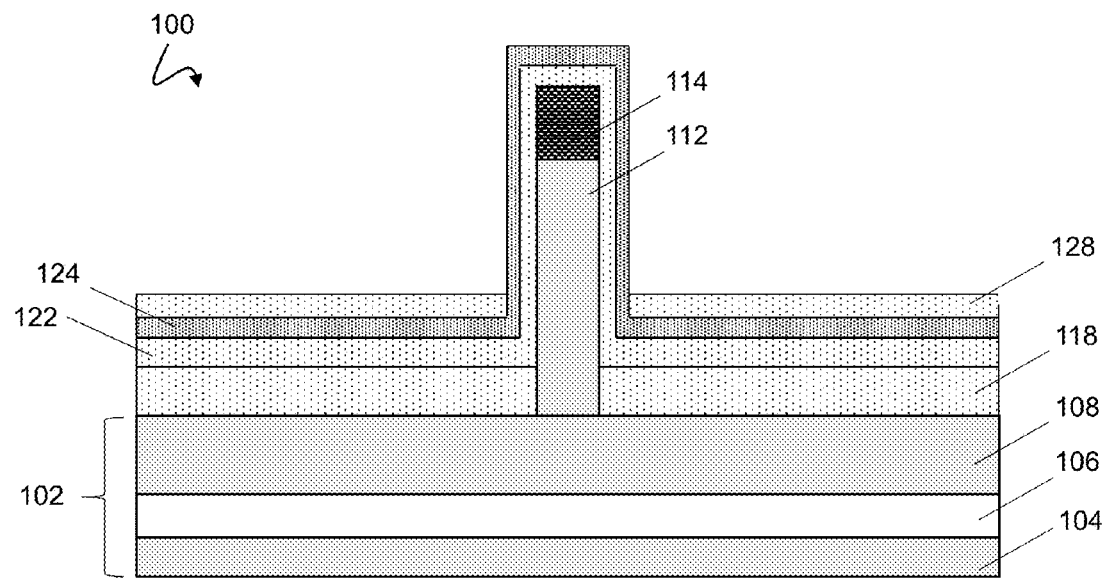

FIGS. 19-32 show a cross-sectional view of an integrated circuit structure being processed and formed according to alternative embodiments of the present disclosure. Although FIGS. 19-32 are shown by example as an alternative process flow, it is understood that the processes discussed herein relative to FIGS. 19-32 may be implemented in combination with the processes of FIGS. 1-18 and/or other processes described herein. In this embodiment, IC structure 100 may be formed as described with respect to FIGS. 1-3. After nitride layer 124 is formed, dielectric layer 128 may be formed adjacent to fin 112 and over horizontal portions of nitride layer 124 that are over substrate 102 as shown in FIG. 19. That is, dielectric layer 128 may be formed without the subsequent formation of forming dummy gate material 132 as described with respect to FIG. 4. Additionally, dielectric layer 128 may be formed such that a substantial portion of nitride layer 124 that is surrounding fin 112, or is along a vertical length of fin 112, is exposed.

Figure 20:
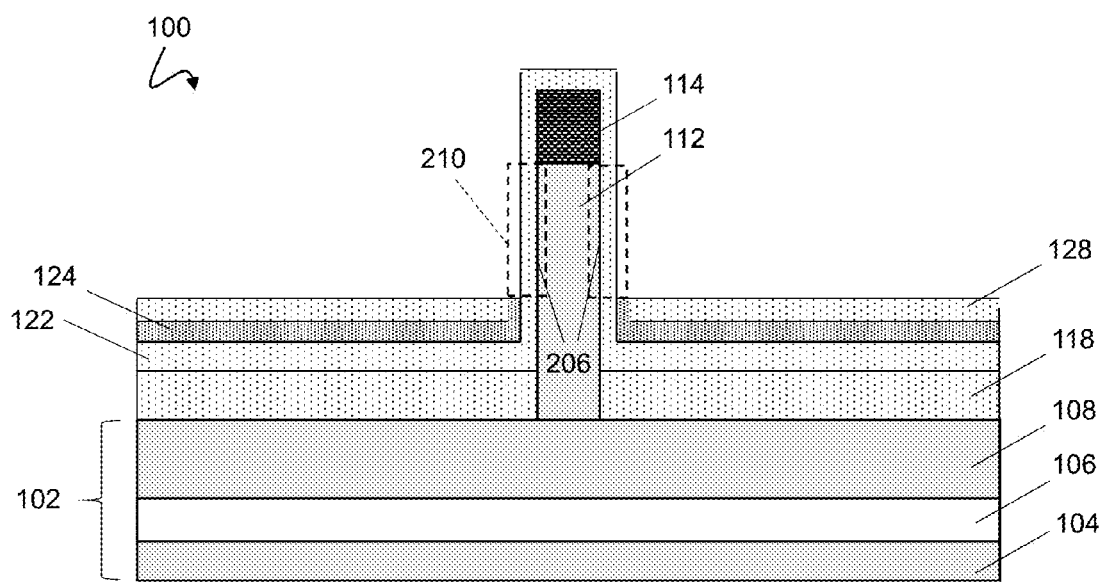

Referring now to FIG. 20, the exposed portions of nitride layer 124 may be selectively removed from surrounding the vertical length of fin 112 to expose oxide layer 122 thereunder that surrounds fin 112. The exposure of oxide layer 122 includes exposing a portion 210 (shown by phantom boxes) of oxide layer 122 that is immediately adjacent to sidewalls 206 of fin 112. Nitride layer 124 may be selectively removed by etching, e.g., phosphoric acid-based etch or reactive-ion flouring-based chemistry.

Figure 21:
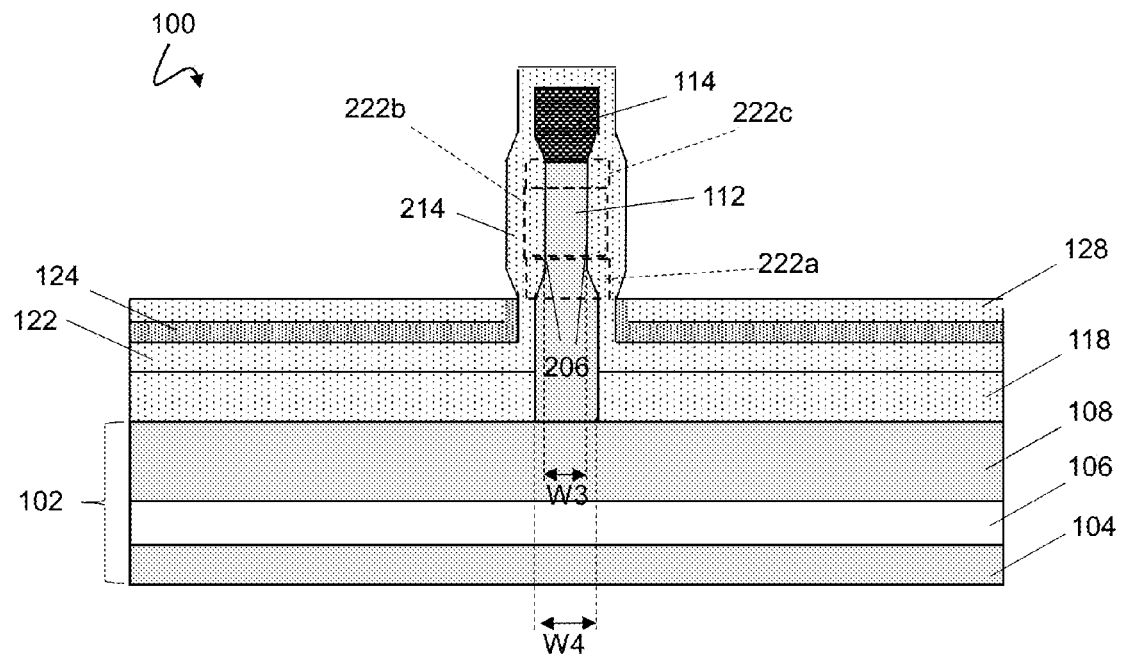

As shown in FIG. 21, a thermal oxidation may be performed on IC structure 100 to oxidize sidewalls 138 of fin 112. The thermal oxidation may result in a portion of fin 112 at sidewalls 206 of fin 112 that is adjacent to portion 210 (FIG. 20) of oxide layer 122 to oxidize, thereby forming oxidized portion 214. In this way, oxide layer 122 of portion 210 (FIG. 20) reacts with the material of fin 112 such that a portion (e.g., oxidized portion 214) of fin 112 becomes an oxide, e.g., silicon dioxide. The oxidation of IC structure 100, and more particularly, fin 112, may be controlled by altering the temperature and pressure of the oxidation until the desired amount of oxidation of fin 112 is performed. The temperature used during the oxidation process may include a temperature of, e.g., approximately 800° C. to approximately 1200° C. The pressure used during the oxidation process may include a pressure of, e.g., approximately 1 atmosphere to approximately 25 atmospheres.

The controlled oxidation of fin 112 may result in fin 112 having a tapered region 222a below a central region 222b of fin 112. As shown, oxidation of fin 112 reduces a width W3 of fin 112 at central region 222b of fin 112. That is, width W3 at central region 222b of fin 112 is less than a width W4 of fin 112 at sidewalls 206 of portions of fin 112 that were not oxidized. Width W3 of fin 112 is reduced due to a portion of fin 112 at central region 222a being reacted with portion 210 (FIG. 20) of oxide layer 122. Additionally, as shown in FIG. 21, the oxidation results in tapered region 222a being formed below central region 222b. Within the tapered region 222a of fin 112, a width of fin 112 gradually expands away from central region 222b. That is, less of fin 112 is oxidized further from central region 222b due to oxide layer 122 at regions away from central region 222b being protected by other materials, e.g., nitride layer 124.

This embodiment differs from the embodiment in described in FIGS. 1-18 in part due to a top region 222c of fin 112 above central region 222b not being tapered. In the embodiment described in FIGS. 1-18, a portion of oxide layer 122 can be covered by spacers 136 (FIG. 7), therefore, the region of fin 112 above central region 112b (FIG. 7) was also tapered. However, in this embodiment, oxide layer 122 above central region 222b is not covered by another material, therefore, the thermal oxidation process can be controlled via altering temperature and pressure such that top region 222c of fin 112 is not tapered.

Figure 22:
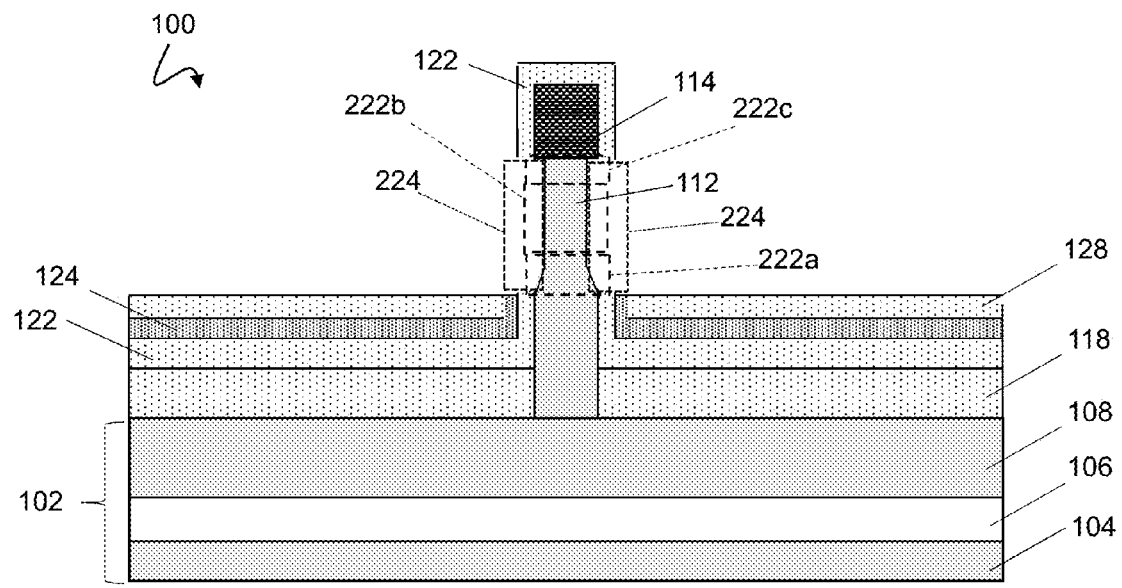

After desired amount of oxidation is completed, oxidized portion 214 (FIG. 7) may be selectively removed, e.g., by etching using dilute HF, from sidewall 138 of fin 112 as shown in FIG. 22 to create voids 224. The removal of oxidized portion 214 results in fin 112 remaining over substrate 102 with central region 222b, top region 222c, and tapered region 222a. Voids 224 expose central region 222b, tapered region 222a, and top region 222c of fin 112. Voids 224 may be formed on opposing sides of fin 112 and may be defined by a region beneath remaining portions of oxide layer 122 adjacent to hard mask 114, over dielectric layer 128, and adjacent to exposed central region 222b, tapered region 222a, and top region 222c of fin 112. While this process is targeted to selectively remove oxidized portion 214, it is to be understood that this selective removal process may also incidentally remove small portions of dielectric layer 128.

Figure 23:
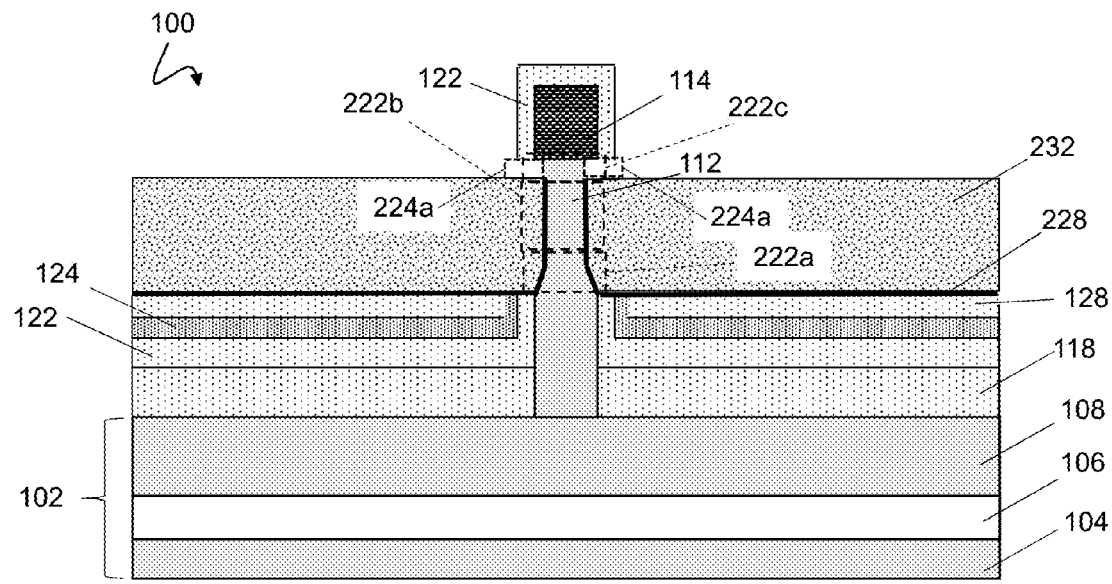

Referring now to FIG. 23, a gate dielectric 228 (represented by thick black line) and gate structure 232 may be formed. Gate dielectric 228 may be formed by conformally depositing gate dielectric 228 over IC structure 100 and etching gate dielectric 224 such that gate dielectric 228 remains substantially lines voids 224 (FIG. 22). After gate dielectric 228 is etched, gate structure 232 may be deposited and etched such that gate structure 232 is substantially surrounded by gate dielectric 228 and substantially fills voids 224. Gate dielectric 228 and gate structure 232 may be disposed over dielectric layers 118, 128, oxide layer 122, and nitride layer 124. Gate dielectric 228 and gate structure 232 may substantially surround at least central region 222b of fin 112. Further, gate dielectric 228 and gate structure 232 may be etched back such that a voids 224 are not completely filled. That is, gate dielectric 228 and gate structure 232 may be etched back such that remaining portions 224a of voids 224 are disposed beneath hard mask 114 and oxide layer 122 which substantially surrounds hard mask 114. This etch back exposes a portion of fin 112 above central region 222b within remaining portion 224a. As shown, remaining portion 224a exposes upper region 222c of fin 112. However, it is to be understood that any portion of gate dielectric 228 and gate structure 232 may be etched back without departing from aspects of the disclosure. Gate dielectric 228 may include any conventional gate dielectric materials such as, for example, silicon dioxide. In some embodiments, gate structure 232 may include another dummy gate material. In such an embodiment, gate structure 232 may include any conventional dummy gate materials, such as, for example, polysilicon. In other embodiments, gate structure 232 may include an active gate structure. In such an embodiment, gate structure 232 may include conventional gate stack materials such as work function metals and conductors that may be chosen based on the desired application of gate structure 232.

Figure 24:
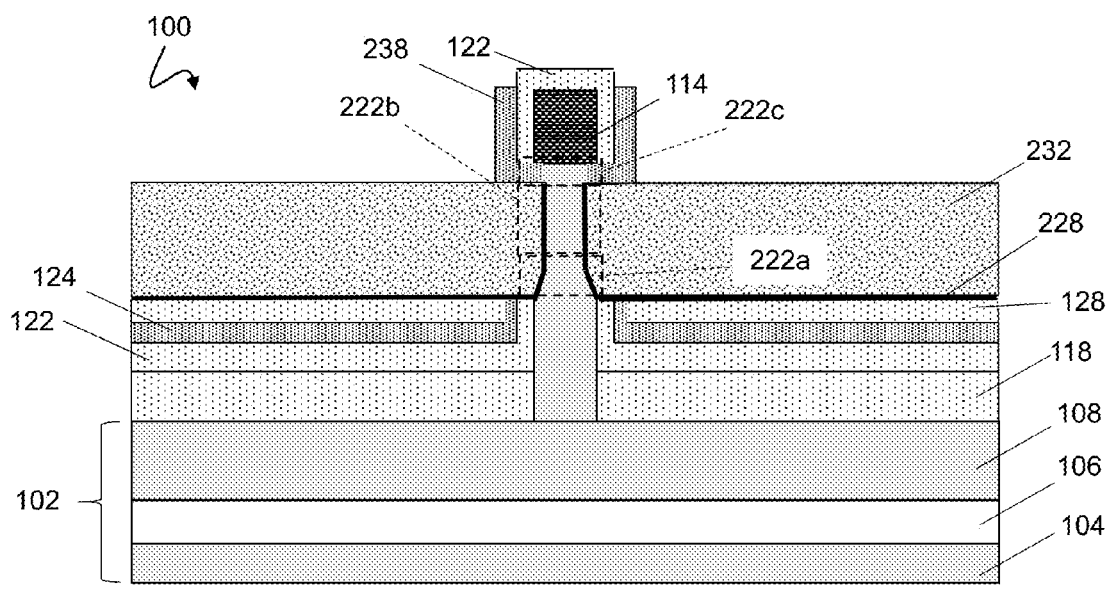

Referring now to FIG. 24, gate spacers 238 may be formed, e.g., via depositing and etching. That is, a gate spacer material may be deposited over the exposed nitride layer gate structure 232 to a desired thickness or height and etched such that a portion of the gate spacer material remains adjacent to fin 112 and hard mask 114 to create gate spacers 238. More particularly, gate spacers 238 may substantially fill remaining portion(s) 224a (FIG. 23) of voids 224 (FIG. 22) and may be disposed adjacent to oxide layer 122. Gate spacers 238 may contact the exposed portion of fin 112 within remaining portion 224a. As shown, gate spacers 238 may be substantially "L-shaped." Gate spacers 238 may include, for example, a nitride such as silicon nitride. In other embodiments, gate spacers 238 may also include any conventional gate spacer materials such as hafnium silicate, hafnium oxide, zirconium silicate, zirconium oxide, silicon oxide, silicon oxynitride, high-k material or any combination of these materials.

Figure 25:
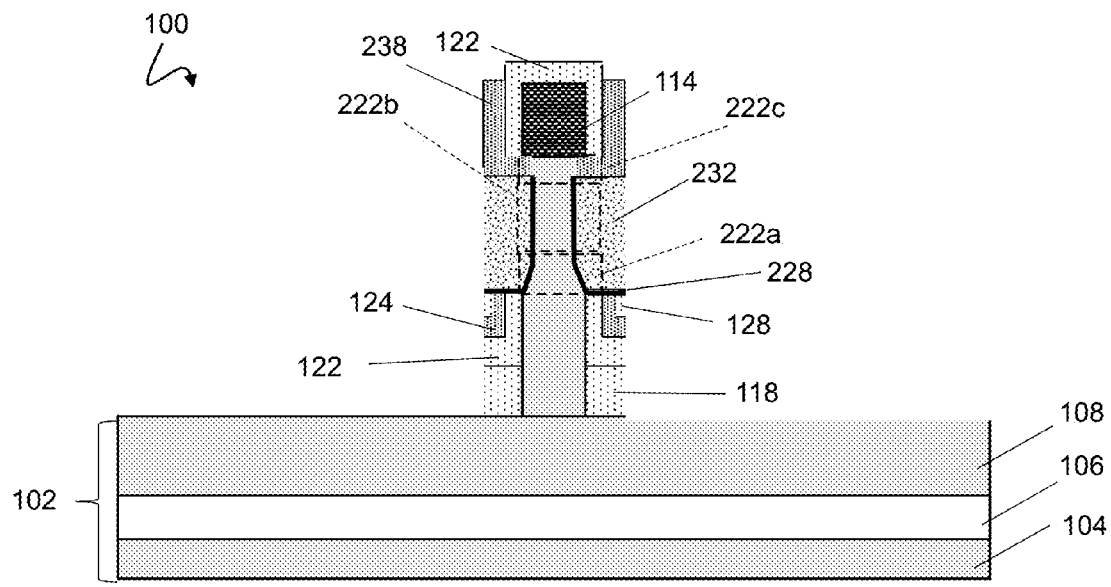
Figure 26:
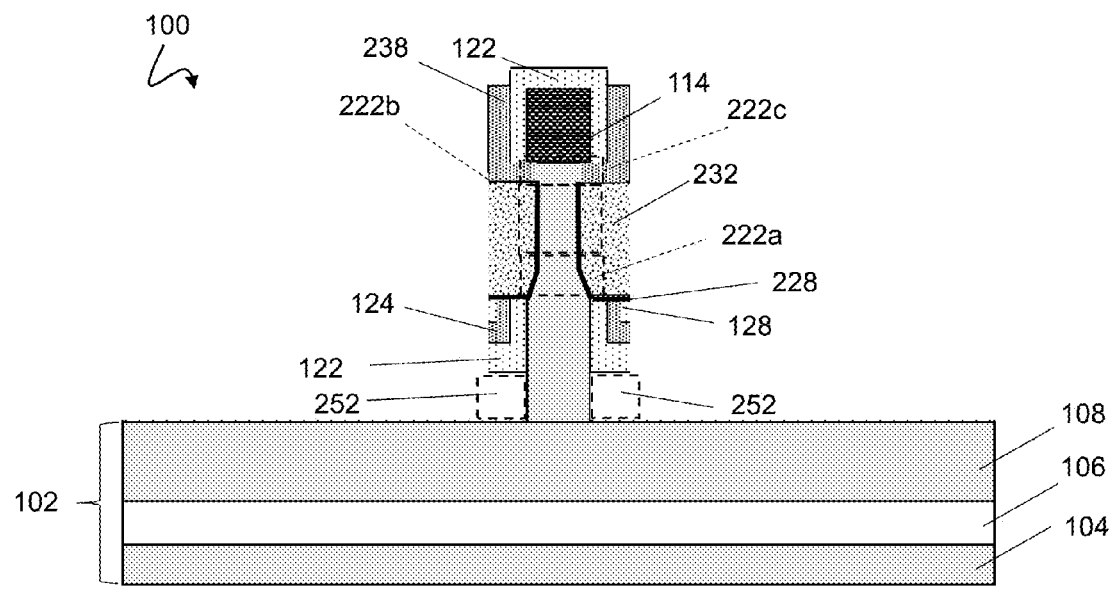

As shown in FIG. 25, another etching, e.g., an anisotropic etch, may be performed to remove material adjacent to fin 112 from over substrate 102 such that material between substrate 102 and gate spacers 238 remain. That is, the etching may remove gate dielectric 228, gate structure 232, dielectric layer 118, oxide layer 122, and nitride layer 124 to expose substrate 102, or more particularly, semiconductor layer 108. During this etching, gate spacers 238 act as a mask such that any portions of gate dielectric 228, gate structure 232, dielectric layer 118, oxide layer 122, or nitride layer 124 beneath or protected by gate spacers 238 is not etched. Subsequently, an isotropic etch is performed such that any portion of dielectric layer 118 beneath gate spacers 238 is selectively etched thereby completely removing any remaining portions of dielectric layer 118 as shown in FIG. 26. Since the etch is selective to dielectric layer 118, gate dielectric 228, gate structure 232, oxide layer 122, and nitride layer 124 substantially remain beneath gate spacers 238. The selective removal of dielectric layer 118 exposes a portion of fin 112 and creates voids 252 on opposing sides of fin 112 beneath remaining portions of oxide layer 122 that are protected by spacers 238. That is, voids 252 are created immediately adjacent to fin 112 in an area over substrate 102 and beneath gate structure 232.

Figure 27:
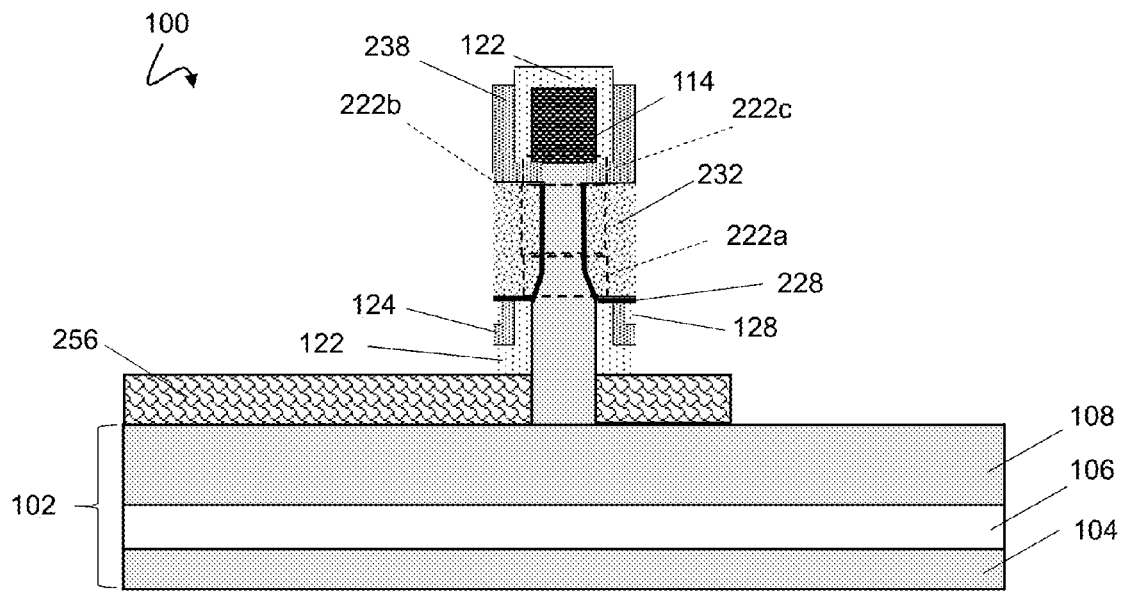

Referring now to FIG. 27, an epitaxial layer 256 may be formed over substrate 102, or more particularly, over semiconductor layer 108 of substrate 102 to substantially fill voids 252 (FIG. 26). Epitaxial layer 256 may be optionally patterned to any desired configuration such that a portion of substrate 102 is exposed. Epitaxial layer 256 may be formed such that epitaxial layer 256 is within voids 252 and substantially surround fin 112 in an area over substrate 102 and beneath gate structure 232, or more particularly, beneath remaining portions of dielectric layer 128, nitride layer 124, and oxide layer 122 that are beneath gate structure 232. Epitaxial layer 256 may be grown below gate structure 232 from a portion of fin 112 below central region 222b of fin 112. Epitaxial layer 256 may include, for example, silicon, silicon germanium, or silicon carbon and may be doped with conventional n-type or p-type dopants.

Figure 28:
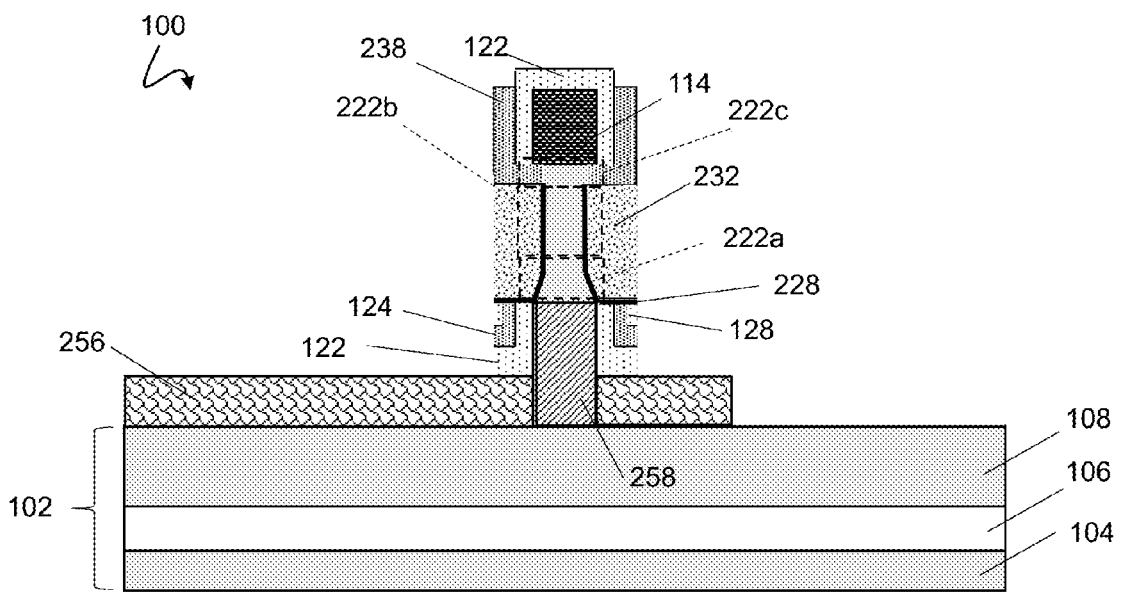
Figure 29:
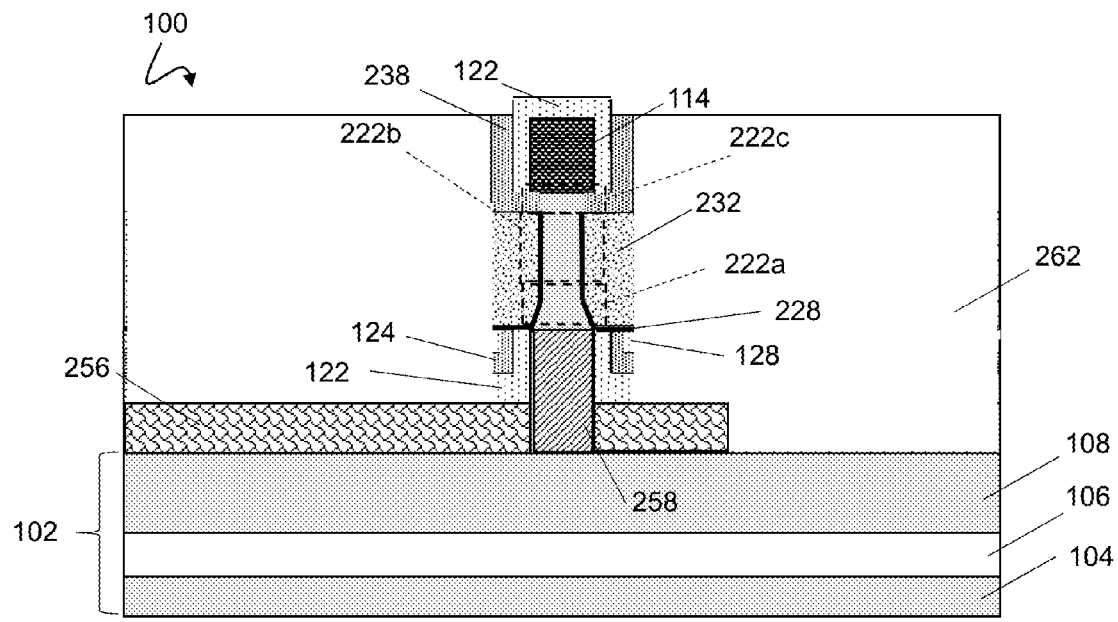

As shown in FIG. 28, epitaxial layer 256 can be annealed such that its composition diffuses into a portion of fin 112 adjacent to epitaxial layer 256. During the annealing, epitaxial layer 256 can diffuse to a point proximal to tapered region 222a. The diffusion causes a source/drain region 258 to be formed within fin 112. Referring now to FIG. 29, an ILD layer 262 may be formed on IC structure 100. ILD layer 262 may be etched back or planarized to a top surface of gate spacers 238 such that a portion of oxide layer 122 is exposed. ILD layer 262 may include any material conventionally used for an ILD layer, such as, for example, silicon nitride, silicon oxide, fluorinated silicon dioxide (FSG), hydrogenated silicon oxycarbide, porous silicon oxycarbide, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 30:
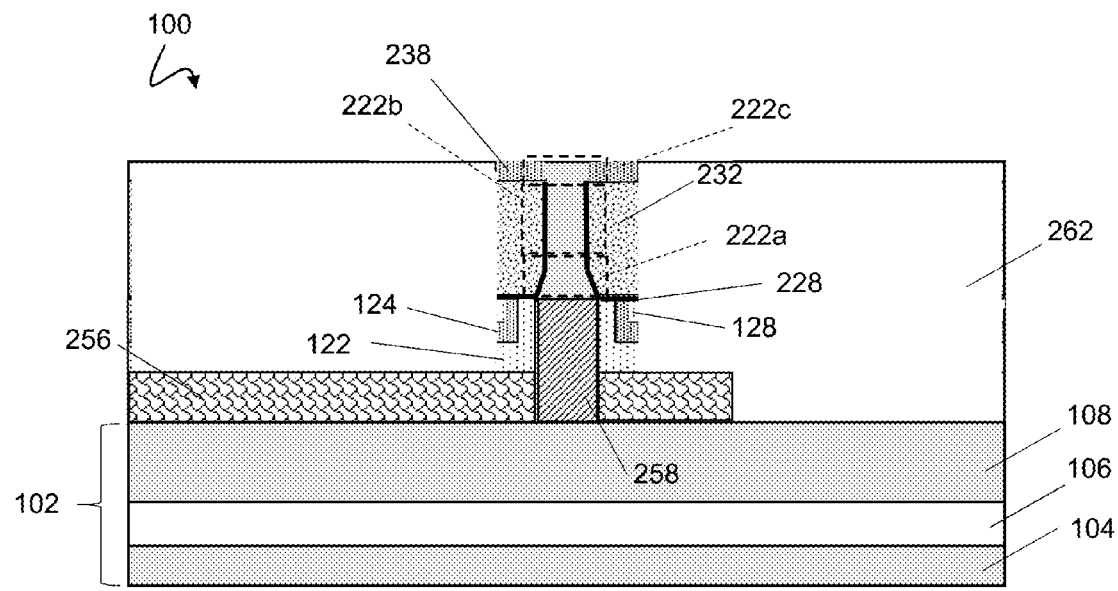
Figure 31:
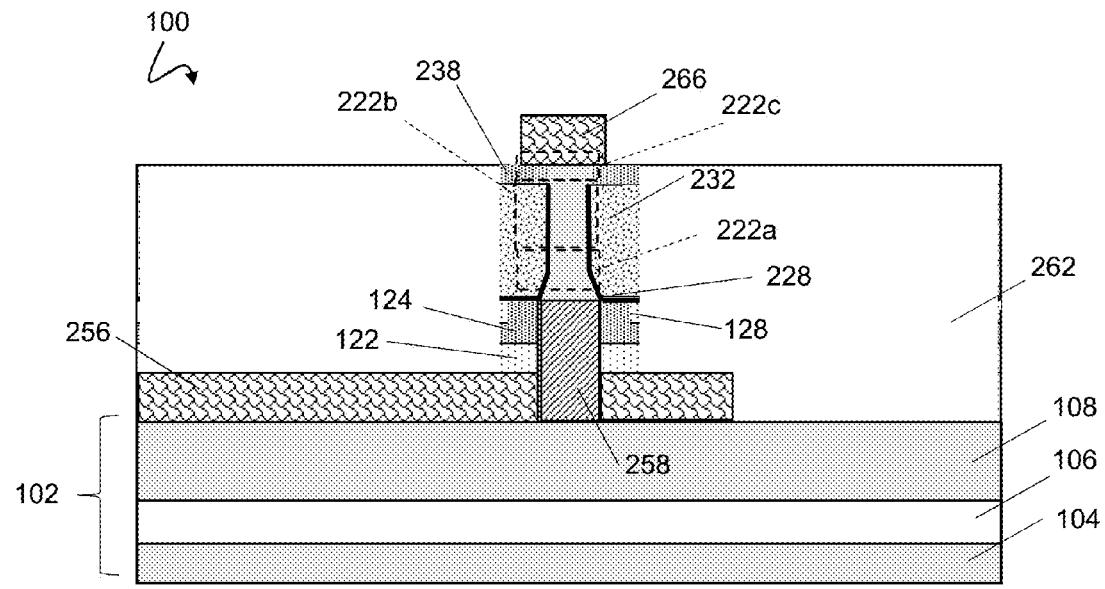

Referring now to FIG. 30, an etching or planarization technique may be performed to expose a top surface of fin 112. As shown, this etching may include removing portions of dielectric layer 262, gate spacers 238, and oxide layer 122. After the top surface of fin 112 is exposed, epitaxial layer 266 may be formed, e.g., grown, such that epitaxial layer 266 contacts a top surface of fin 112 as shown in FIG. 31. Epitaxial layer 266 may include any of the materials listed for epitaxial layer 256. Epitaxial layer may 266 be patterned and etched to any desirable configuration to optionally expose portions of dielectric layer 262 and gate spacers 238.

Figure 32:
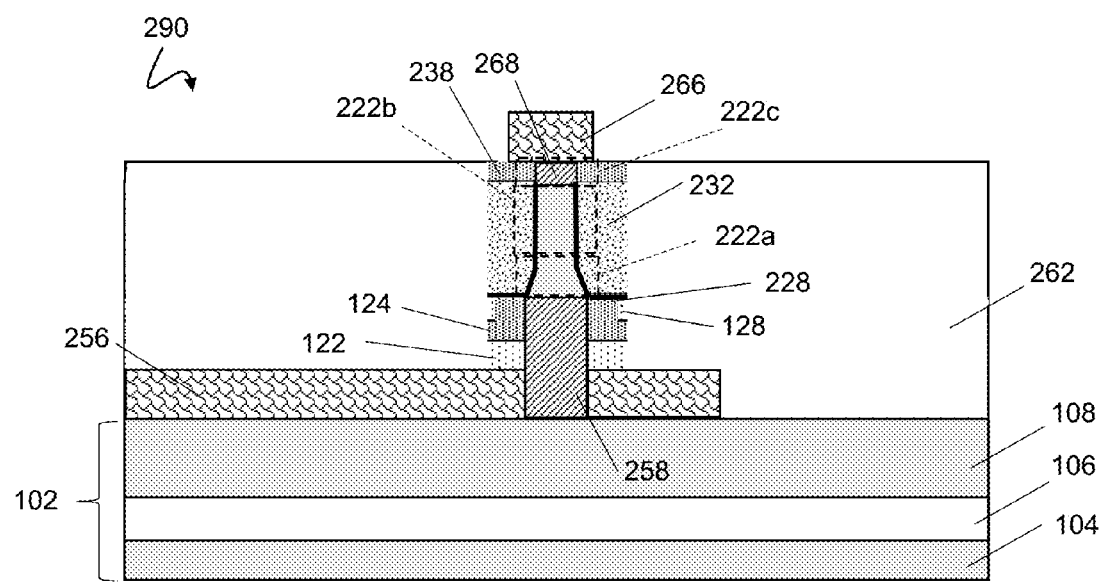

Referring now to FIG. 32, another anneal may be performed such that epitaxial layer 266 diffuses into a portion of fin 112 that is adjacent to epitaxial layer 266. The anneal may be performed such that the composition of epitaxial layer 266 may diffuse to a position just above gate structure 232 during the annealing. The annealing and diffusion can form a source/drain region 268 within fin 112.

The resulting IC structure shown in FIG. 32 may embody a vertical transistor 290. Vertical transistor 290 may include fin 112 having source/drain region 258 and second source/drain region 268. Source/drain region 258 may be positioned over substrate 102 and below central region 222b of fin 112, and source/drain region 268 may be within ILD layer 262 and over central region 212b of fin 112. Gate structure 232 may be disposed within ILD layer 262 between source/drain region 258 and source/drain region 268. Additionally, gate structure 232 may substantially surround central region 212b of fin 112, and in some embodiments, tapered region 222a of fin 112. Gate spacers 238 may extend from a top surface of gate structure 232 to a top surface of ILD layer 162. Fin 112 may also include at least one tapered region 222a from central region 222b of fin 112 to at least one of source/drain region 258. Vertical transistor 290 may also include epitaxial layer 256 positioned over substrate 102 within ILD layer 262 and substantially surrounding source/drain region 258. Further, epitaxial layer 266 may be disposed over source/drain region 268. Oxide layer 122 may be disposed over epitaxial layer 256 in an area between epitaxial layer 122 and gate structure 232. Within the same area, nitride layer 124 may be disposed over oxide layer 122, and dielectric layer 202 may be disposed over a portion of nitride layer 124, beneath gate structure 232. Gate dielectric 228 may substantially separate dielectric layer 202 and nitride layer 124 from gate structure 318.

Figure 33:
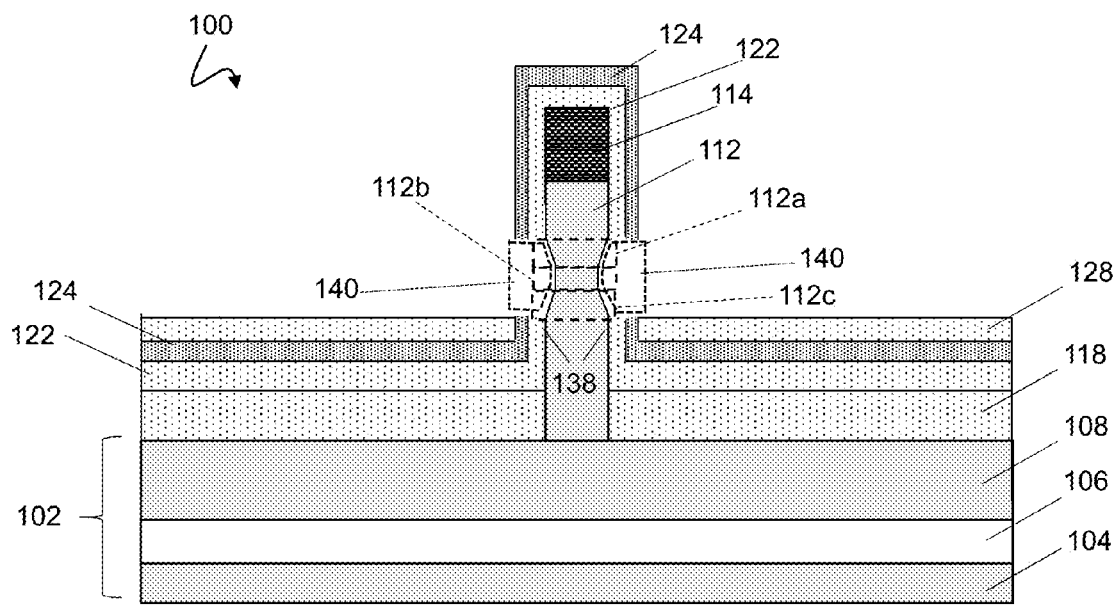
Figure 34:
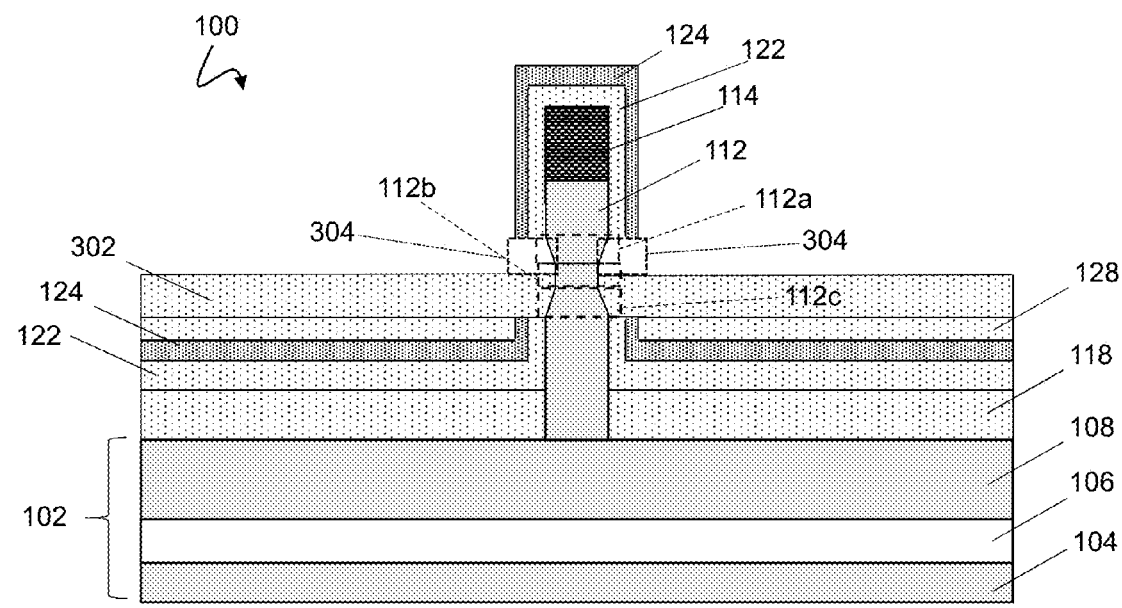

FIGS. 33-43 show a cross-sectional view of an integrated circuit structure undergoing aspects of a method according to another embodiment of the disclosure. Although FIGS. 33-43 are shown by example as an alternative process flow, it is understood that the processes discussed herein relative to FIGS. 33-43 may be implemented in combination with the processes of FIGS. 1-18, 19-32, and/or other processes described herein. In an embodiment, IC structure 100 may be processed as described with respect to FIGS. 1-8. However, during the removal of oxidized portion 144 (FIG. 7) to create voids 140, spacers 136 (FIG. 7) may also be removed to expose nitride layer 124 above oxidized portion 144 as shown in FIG. 33. Referring now to FIG. 44, a dielectric layer 302 may be formed laterally adjacent to fin 112, and over exposed portions dielectric layer 128, nitride layer 124, and oxide layer 122. As shown in FIG. 34, dielectric layer 302 partially covers portions of fin 112 that were exposed after the removal of oxidized portion 144 (FIG. 7). That is, dielectric layer 302 may partially fill voids 140 (FIG. 33) such that a remaining portion 304 of voids 140 exposes at least a portion of fin 112, e.g., tapered region 112a. Further, the portion of nitride layer 124 that was previously covered by spacers 136 remains exposed after the forming of dielectric layer 302.

Figure 35:
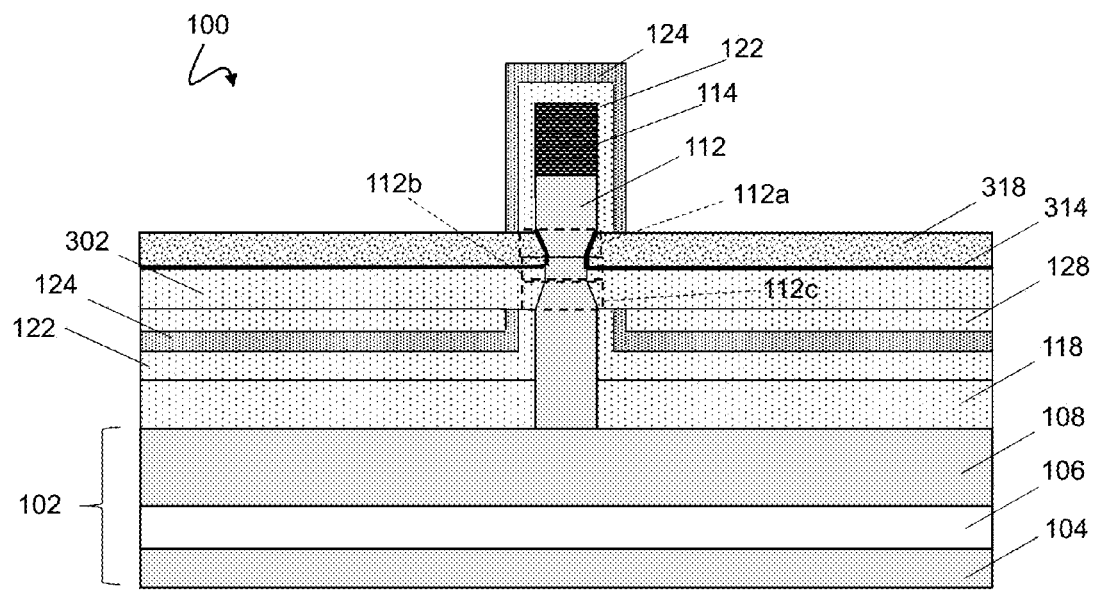

Subsequently, a gate dielectric 314 (represented by thick black line) and gate structure 318 may be formed as shown in FIG. 35. Gate dielectric 314 may be formed by conformally depositing gate dielectric 314 over IC structure 100 such that gate dielectric 314 lines remaining portions 140a and oxide layer 302. After gate dielectric 314 is deposited, gate structure 318 may be deposited such that gate structure 318 is substantially surrounded by gate dielectric 314 and substantially fills remaining portion 140a. Gate dielectric 314 and gate structure 318 may be disposed over dielectric layers 118, 128, 302 oxide layer 122, and nitride layer 124. Further, gate dielectric 314 and gate structure 318 may substantially surround at least central region 112b of fin. Gate dielectric 314 may include any conventional gate dielectric materials such as, for example, silicon dioxide. In some embodiments, gate structure 318 may include another dummy gate material. In such an embodiment, gate structure 318 may include any conventional dummy gate materials, such as, for example, polysilicon. In other embodiments, gate structure 318 may include an active gate structure. Here, gate structure 318 may include conventional gate stack materials such as work function metals and conductors that may be chosen based on the desired application of gate structure 318.

Figure 36:
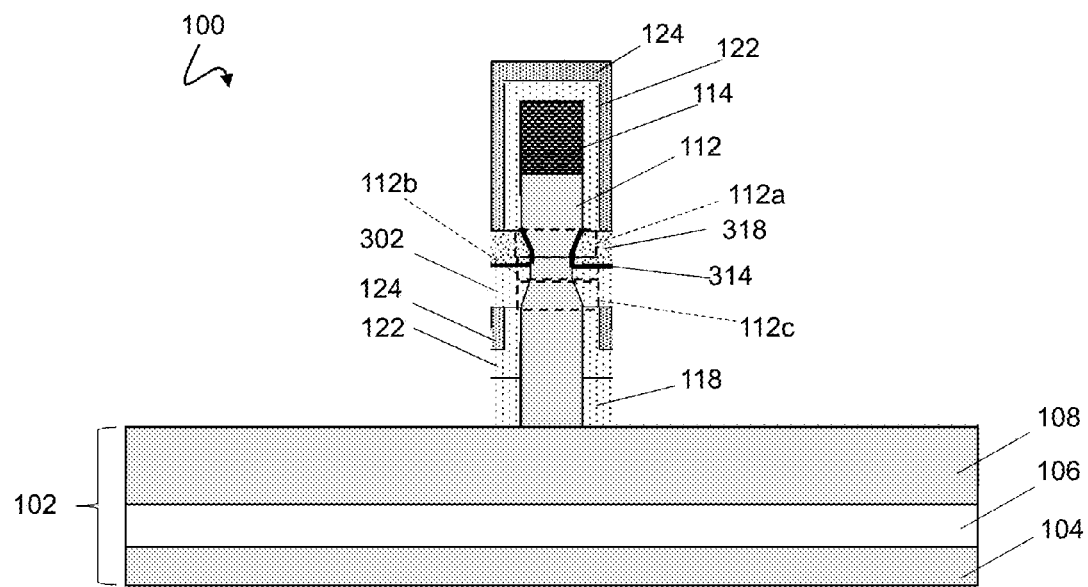
Figure 37:
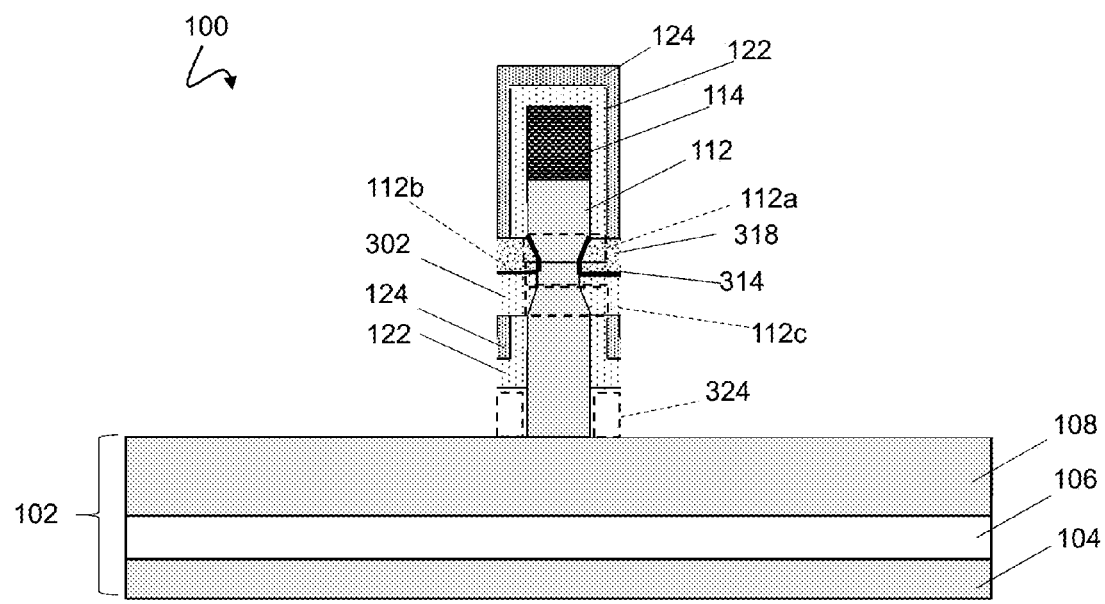

Referring now to FIG. 36, another etching, e.g., an anisotropic etch, may be performed to remove material adjacent to fin 112 from over substrate 102 such that material between substrate 102 and exposed nitride layer 124 remain. That is, etching gate dielectric 314, gate structure 318, dielectric layers 118, 302, oxide layer 122, and horizontal portions of nitride layer 124 can expose substrate 102, or more particularly, semiconductor layer 108. During the etching, nitride layer 124 which substantially surrounds fin 112 (or along a vertical length of fin 112) can act as a mask such that any portions of gate dielectric 314, gate structure 318, dielectric layers 118, 302, oxide layer 122, or nitride layer 124 beneath or protected by nitride layer 124 are not etched. Subsequently, an isotropic etch is performed such that any portion of dielectric layer 118 beneath nitride layer 124 is selectively etched, thereby completely removing any remaining portions of dielectric layer 118 as shown in FIG. 37. Since the etch is selective to dielectric layer 118, gate dielectric 314, gate structure 318, oxide layer 122, and dielectric layer 302, substantially remain beneath nitride layer 124. The selective removal of dielectric layer 118 exposes a portion of fin 112 and creates voids 324 on opposing sides of fin 112, e.g., beneath remaining portions of oxide layer 122 that is protected by nitride layer 124. That is, voids 324 are created immediately adjacent to fin 112 in an area over substrate 102 and beneath gate structure 318.

Figure 38:
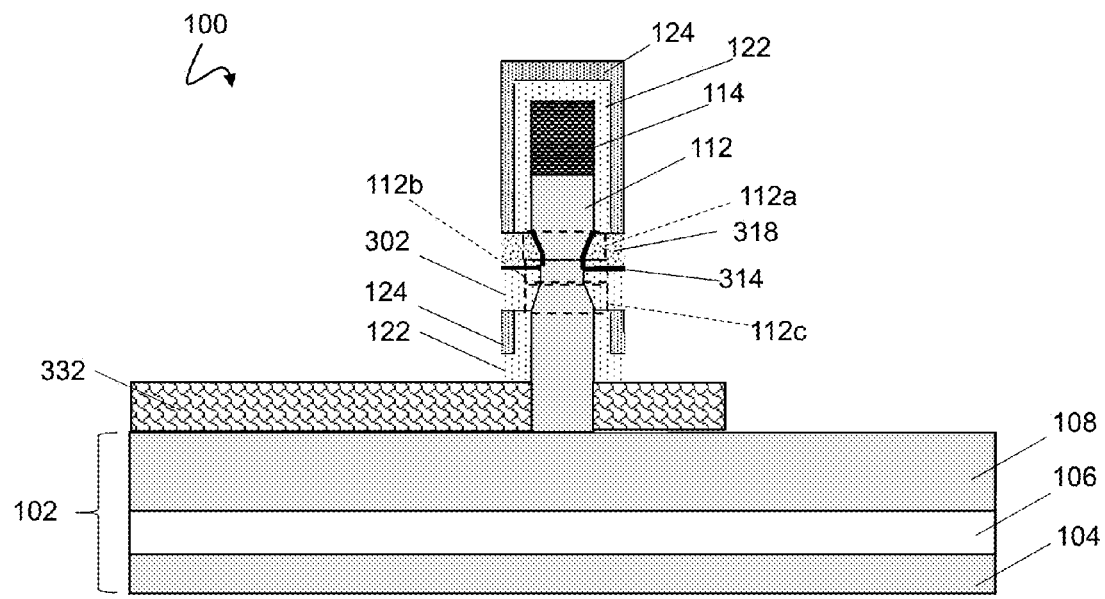

Referring now to FIG. 38, an epitaxial layer 332 may be formed over substrate 102, or more particularly, over semiconductor layer 108 of substrate 102 to substantially fill voids 324 (FIG. 37). Epitaxial layer 332 may be optionally patterned to any desired configuration such that a portion of substrate 102 is exposed. Epitaxial layer 332 may be formed such that epitaxial layer 332 is formed within voids 224 and substantially surrounds fin 112 in an area over substrate 102 and beneath gate structure 318, or more particularly, beneath remaining portions of dielectric layers 128, 302 nitride layer 124, and oxide layer 122 that are beneath gate structure 150. Epitaxial layer 332 may be grown below gate structure 318 from a portion of fin 112 below central region 112b of fin 112. Epitaxial layer 332 may include, for example, silicon, silicon germanium, or silicon carbon and may be doped with conventional n-type or p-type dopants.

Figure 39:
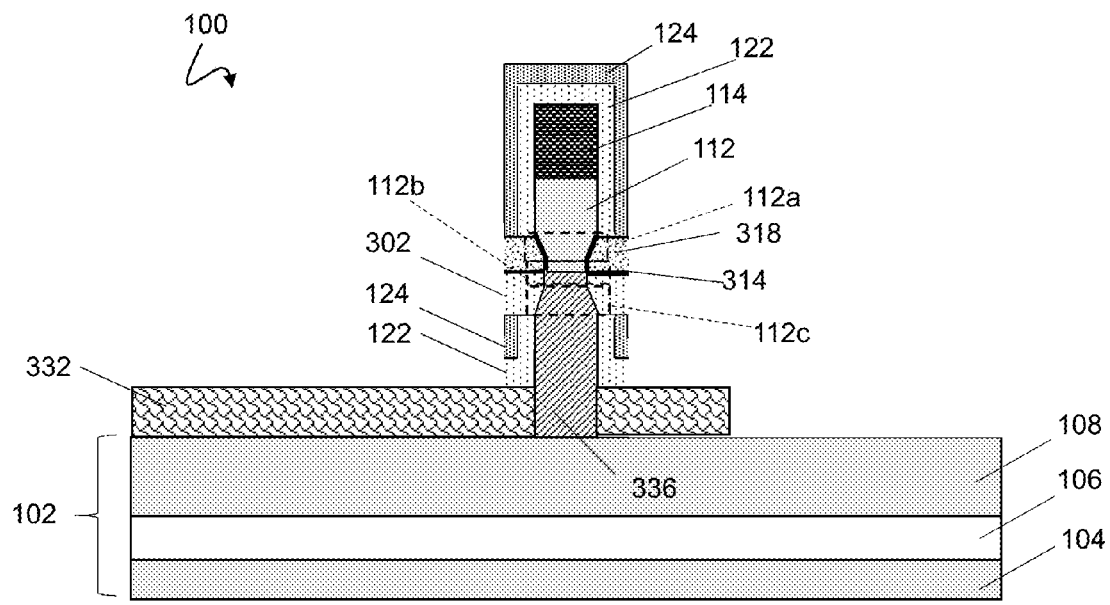
Figure 40:
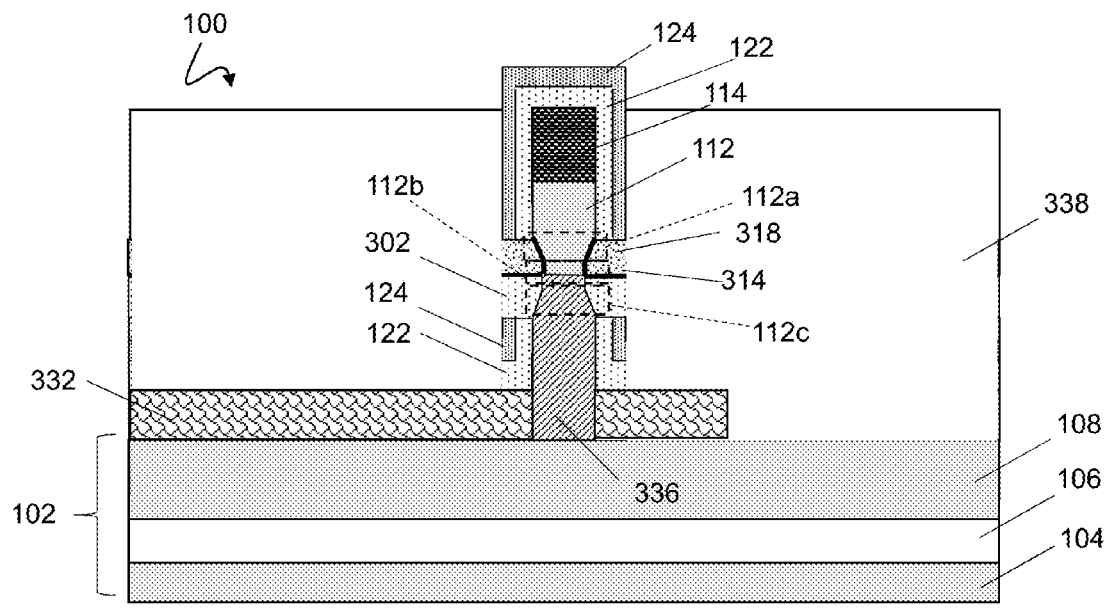

As shown in FIG. 39, epitaxial layer 332 may be annealed such that portions of its composition diffuse into a portion of fin 112 positioned proximal to epitaxial layer 332. The annealing of epitaxial layer 332 may be performed such that epitaxial layer 332 diffuses to a point proximal to gate dielectric 314. The diffusion causes a source/drain region 336 to be formed within fin 112. Referring now to FIG. 40, an ILD layer 338 may be formed on IC structure 100. ILD layer 338 may be etched back or planarized to a top surface of hard mask 114 such that a portion of nitride layer 124 is exposed. ILD layer 338 may include any material conventionally used for an ILD layer, such as, for example, silicon nitride, silicon oxide, fluorinated silicon dioxide (FSG), hydrogenated silicon oxycarbide, porous silicon oxycarbide, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 41:
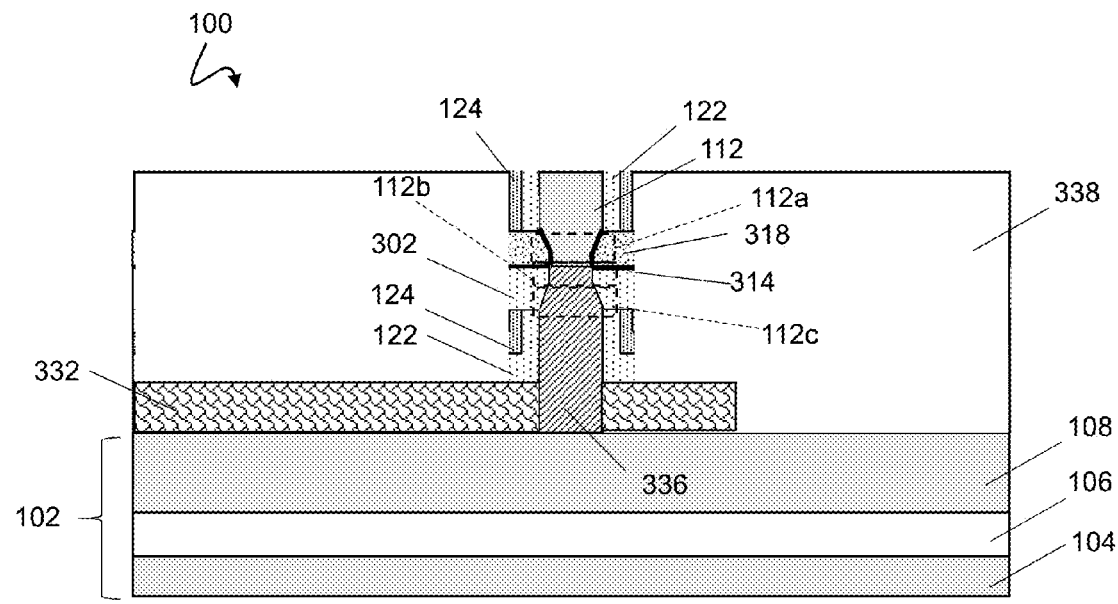
Figure 42:
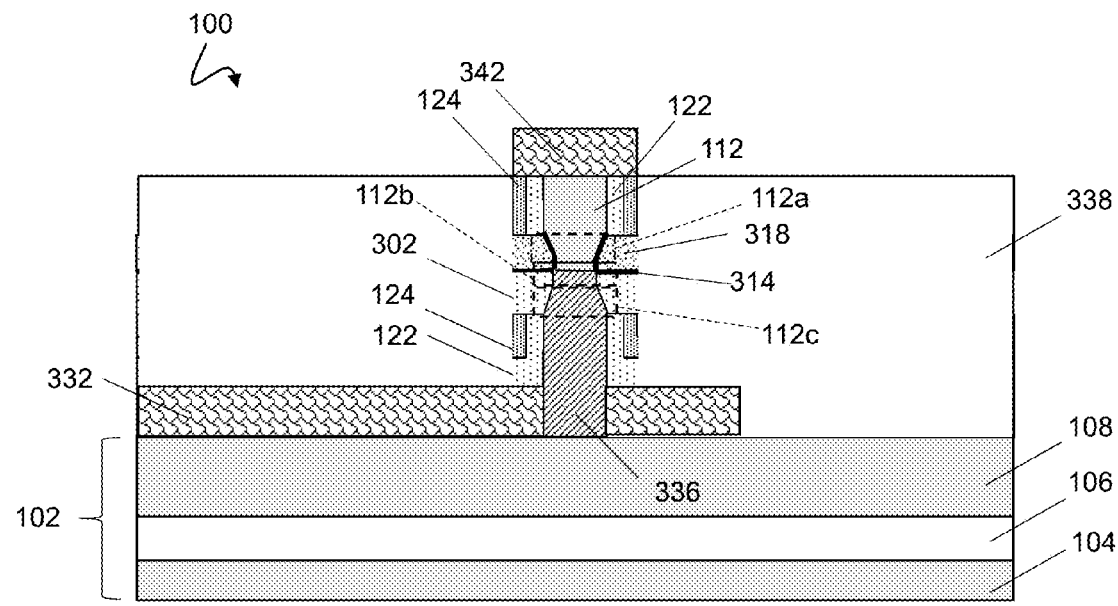

Referring now to FIG. 41, an etching or planarization technique may be performed to expose a top surface of fin 112. As shown, this etching may include removing portions of ILD layer 338, hard mask 114, nitride layer 124, and oxide layer 122. After the top surface of fin 112 is exposed, an epitaxial layer 342 may be formed such that epitaxial layer 342 contacts a top surface of fin 112 as shown in FIG. 42. Epitaxial layer 342 may include any of the materials listed for epitaxial layer 332. Epitaxial layer may 342 be patterned and etched to any desirable configuration to optionally expose portions of ILD layer 338 and nitride layer 124.

Figure 43:
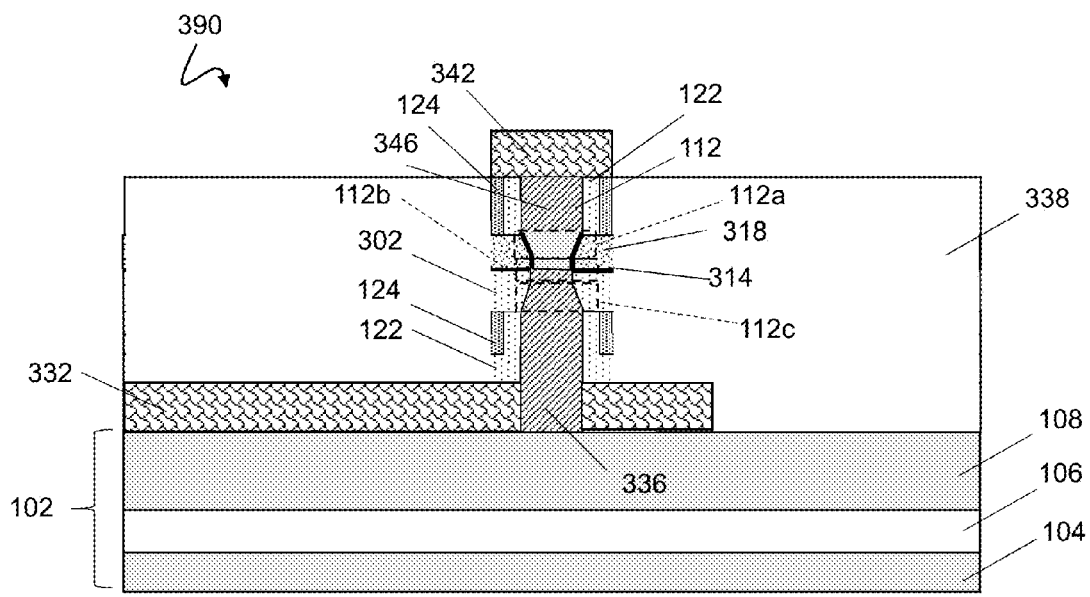
Figure 44:
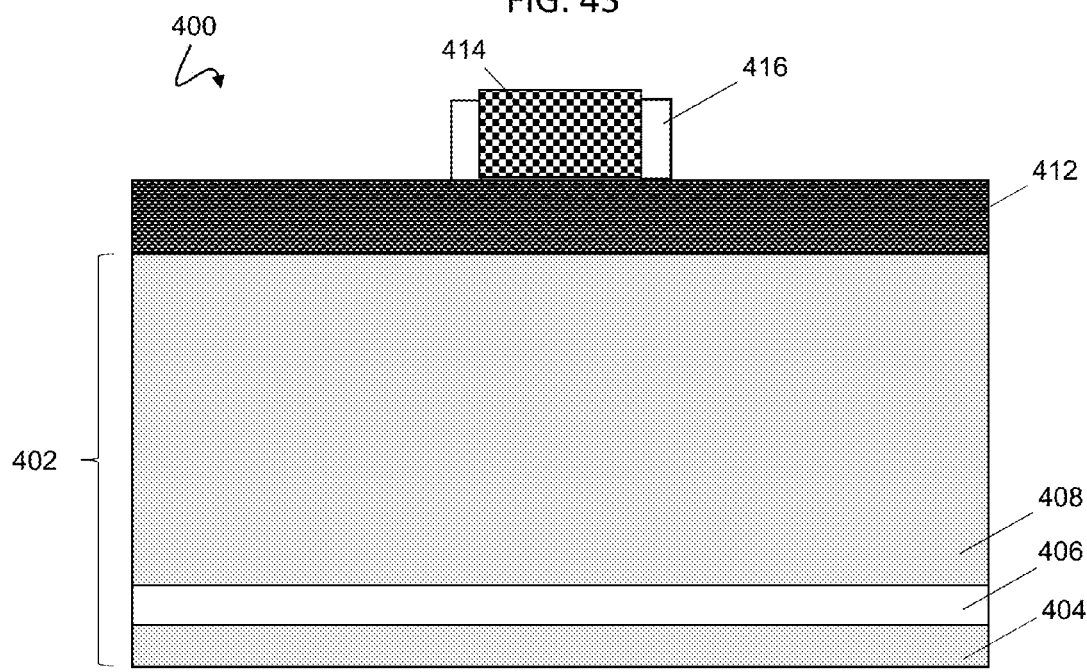

Referring now to FIG. 43, another anneal may be performed such that epitaxial layer 342 diffuses into a portion of fin 112 that is adjacent to epitaxial layer 342. The annealing may be performed such that epitaxial layer 342 diffuses to a point just positioned above tapered region 112a. The diffusion causes a source/drain region 346 to be formed within fin 112.

The resulting IC structure shown in FIG. 43 may embody a vertical transistor 390. Vertical transistor 390 may include fin 112 having source/drain region 336 and source/drain region 346. Source/drain region 336 may be over substrate 102 and below central region 112b of fin 112, and source/drain region 346 may be within ILD layer 338 and over central region 112b of fin 112. Gate structure 318 may be disposed within ILD layer 338 between source/drain region 336 and source/drain region 346. Additionally, gate structure 318 may substantially surround portions of central region 112b and tapered region 112a of fin 112. Fin 112 may also include at least one tapered region 112a, 112c from central region 112b of fin 112 to at least one of source/drain region 336, 346. In some embodiments (shown), vertical transistor 390 may include tapered region 112c to source/drain region 336 and tapered region 112a to source/drain region 346. Vertical transistor 390 may also include epitaxial layer 332 over substrate 102 within ILD layer 338 and substantially surrounding source/drain region 336. Further, epitaxial layer 342 may be disposed over source/drain region 346. Oxide layer 122 may be disposed over at least a portion of epitaxial layer 336 in an area between epitaxial layer 332 and gate structure 314. Within the same area, nitride layer 124 may be disposed over oxide layer 122 and oxide layer 302 may be disposed over a portion of nitride layer 124. Gate dielectric 314 may substantially separate oxide layer 302 and gate structure 318.

Within an area above gate structure 318 and beneath epitaxial layer 342 within ILD layer 338, oxide layer 122 may be disposed adjacent to source/drain region 336. Oxide layer 122 may substantially surround source/drain region 336, based on this relative positioning. Further, within the same area, nitride layer 124 may be disposed adjacent to and substantially surround oxide layer 122.

FIGS. 44-64 show a cross-sectional view of an integrated circuit structure undergoing aspects of a method according to another embodiment of the disclosure. Although FIGS. 44-64 are shown by example as an alternative process flow, it is understood that the processes discussed herein relative to FIGS. 44-64 may be implemented in combination with the processes of FIGS. 1-18, 19-32, 33-43, and/or other processes described herein. Beginning with FIG. 44, a preliminary IC structure 400 is shown. IC structure 400 may include a substrate 402. Substrate 402 may include any of the materials discussed with respect to substrate 102 (FIG. 1). For example, substrate 402 may include a semiconductor layer 404. Overlying semiconductor layer 404 may be an insulating layer 406. Further, another semiconductor layer 408 may overlie insulating layer 406. Semiconductor layers 404, 408 and insulating layer 406 may include any of the materials discussed relative to semiconductor layers 104, 108 (FIG. 1) and insulating layer 106 (FIG. 1), respectively. Substrate 402 may be formed by depositing insulating layer 406 over semiconductor layer 404 and depositing semiconductor layer 408 over insulating layer 406.

IC structure 400 may also include a hard mask 412 overlying substrate 102, or more particularly, semiconductor layer 408 of substrate 402. Hard mask 412 may be formed, for example, by depositing hard mask 412 over semiconductor layer 408. Hard mask 412 may include any of the materials discussed relative to hard mask 114 (FIG. 1). Further, IC structure 400 may also include a mandrel 414 substantially surrounded by spacers 416. As will be described herein, mandrel 414 may facilitate the formation of fins. Mandrel 414 may include, for example, polycrystalline silicon or organic material, and spacers 416 may include, for example, silicon dioxide or silicon nitride.

Figure 45:
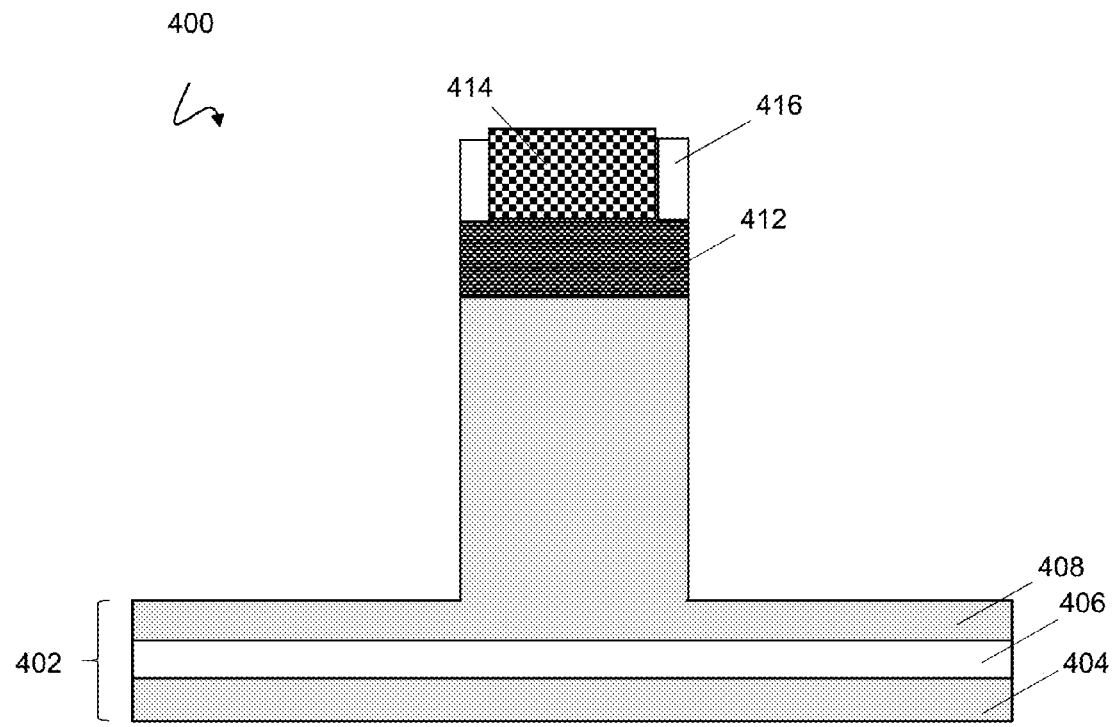

Referring now to FIG. 45, an etching may be performed to remove portions of exposed hard mask 412 and semiconductor layer 408. During such etching, spacers 416 and mandrel 414 act as a mask. Therefore, hard mask 412 and semiconductor 408 below mandrel 414 and spacers 416 are not etched. Etching of semiconductor layer 408 may be performed to any desirable amount. As shown in FIG. 45, a portion of semiconductor layer 408 not covered by spacers 416 or mandrel 414 remains over insulation layer 406. However, in other embodiments, it may be desirable to etch semiconductor layer 408 not covered by mandrel 414 or spacers 416 to a top surface of insulation layer.

Figure 46:
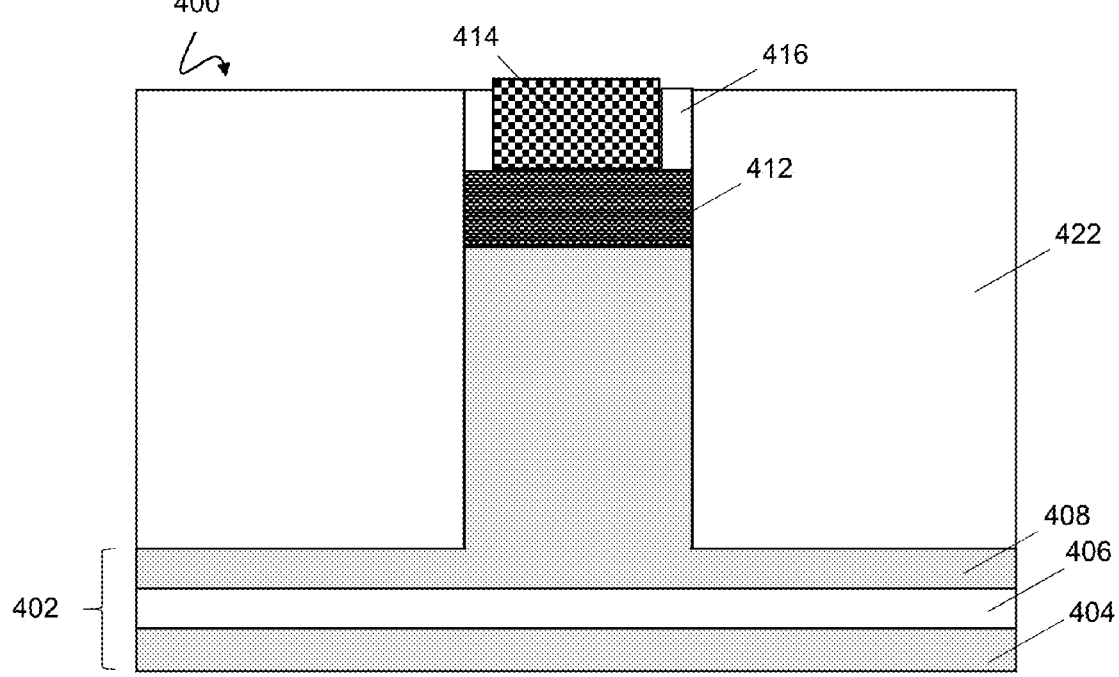
Figure 47:
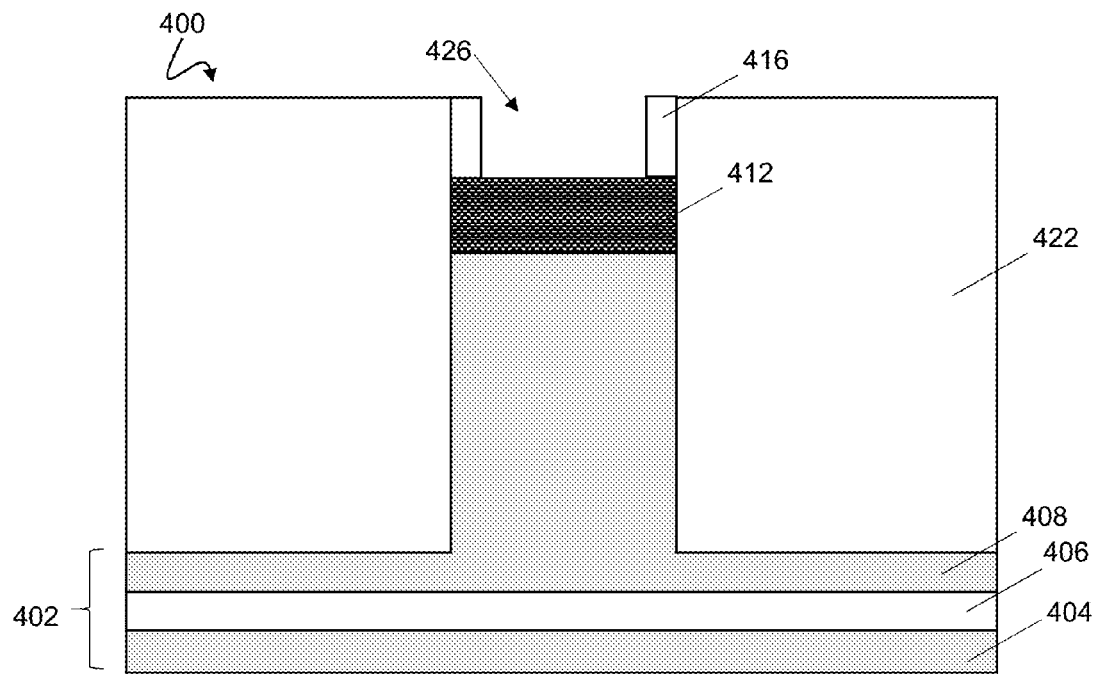
Figure 48:
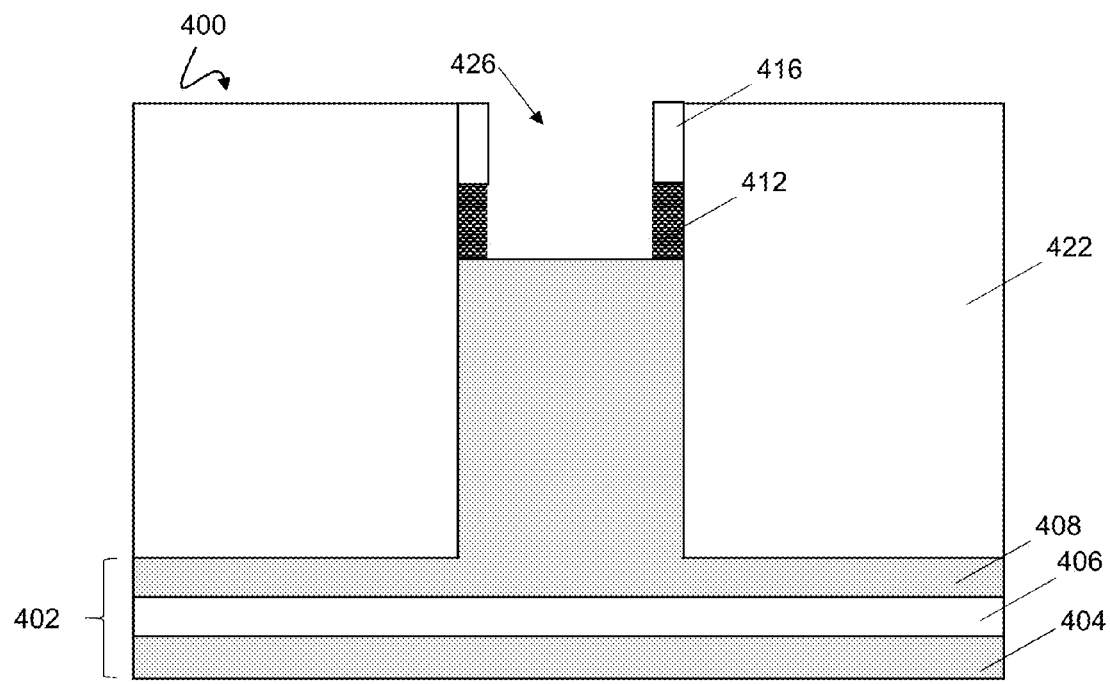

As shown in FIG. 46, a dielectric layer 422 may be formed over IC structure 400. Dielectric layer 422 may be planarized to a top surface of spacers 416 and/or to expose mandrel 414. Dielectric layer 422 may include any of the dielectric materials discussed herein. Once mandrel 414 is exposed, mandrel 414 may be removed to create opening 426 that exposes hard mask 412 beneath mandrel 414 as shown in FIG. 47. Mandrel 414 may be removed by fluorocarbon or bromine-based chemistry RIE. The exposed hard mask 412 may be etched to expose a top surface of the remaining portion of semiconductor layer 408 thereunder as shown in FIG. 48. That is, opening 426 may be expanded by removing portions of hard mask 412.

Figure 49:
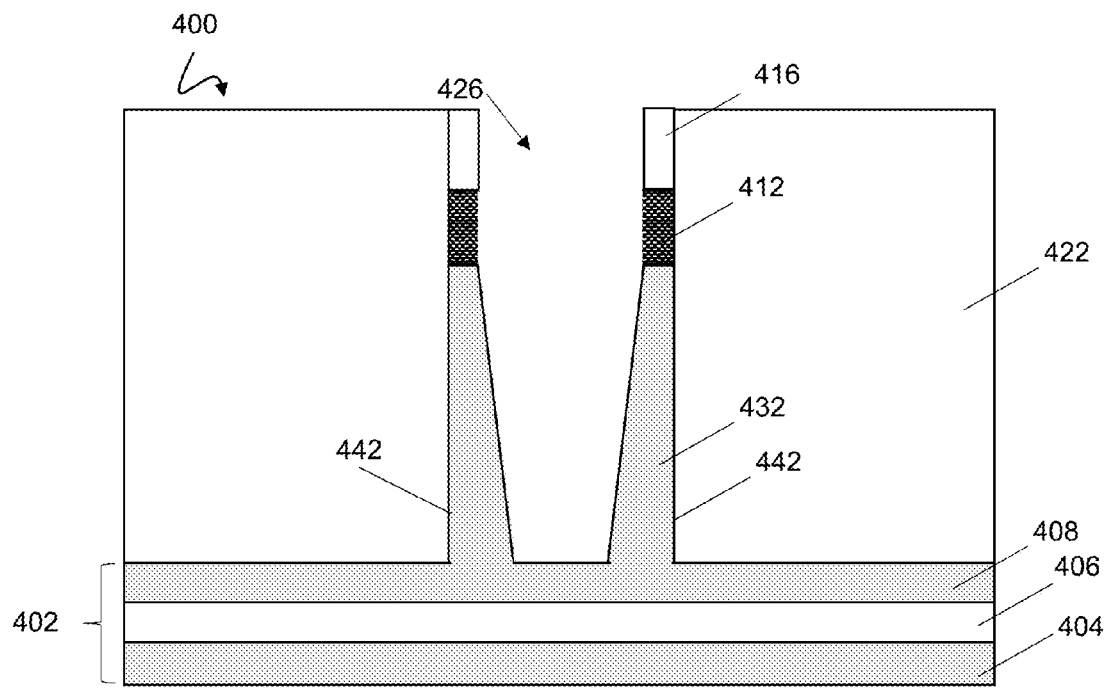
Figure 50:
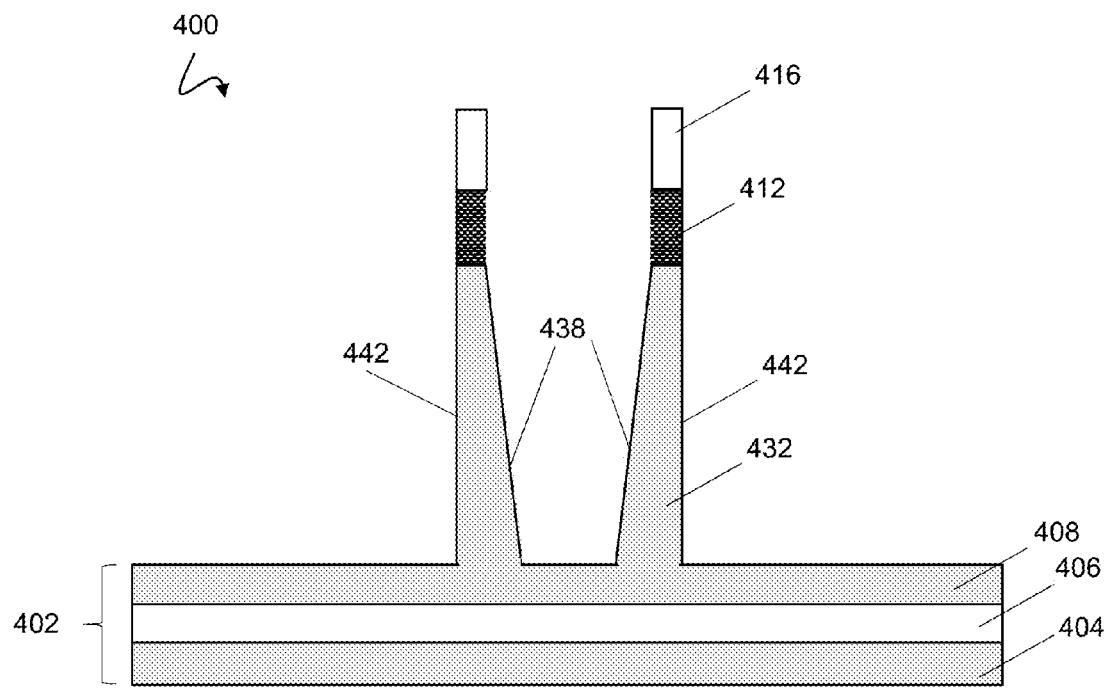

Referring now to FIG. 49, opening 426 may be further expanded by removing potions of remaining semiconductor layer 408 that was beneath mandrel 414 (FIG. 46) and hard mask 412. Expansion of opening 426 during this process results in the creation of fins 432. This process may be performed by using a controlled anisotropic and isotropic etching. As a result, fins 232 may be shaped such that fins 232 include tapered sidewalls 438 which face one another within opening 426. However, since sidewalls 442 of fins 432 outside of opening 426 were not subject to etching due to being protected by dielectric layer 422, sidewalls 442 do not have a tapered shape. After formation of fins 232, dielectric layer 422 may be removed, e.g., via etching, from IC structure 400 as shown in FIG. 50. The removal of dielectric layer 422 exposes semiconductor layer 408 over insulating layer 406 adjacent to fins 432. Additionally, the removal of dielectric layer 422 results in exposure of sidewalls 442 of fins 432.

Figure 51:
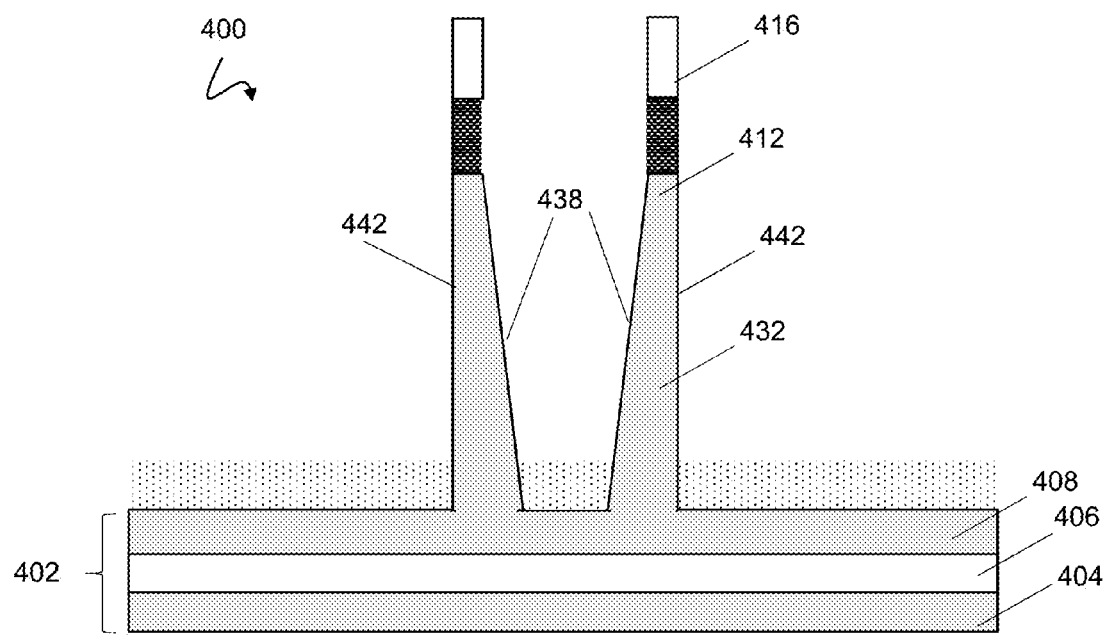
Figure 52:
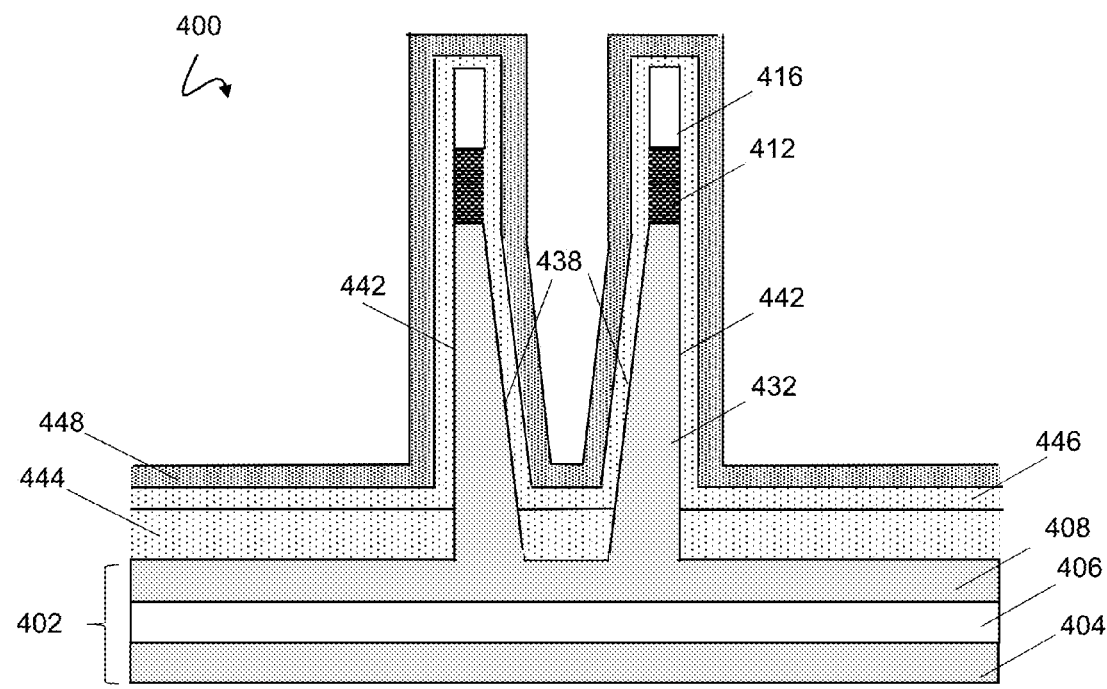

As shown in FIG. 51, a dielectric layer 444 may be formed, e.g., deposited, on horizontal surfaces over semiconductor layer 408 adjacent to fins 432 such that sidewalls 438, 442 of fins 432 are substantially exposed. Dielectric layer 444 may include any of the dielectric materials discussed herein. Further, another dielectric layer 446 and a nitride layer 448 may be conformally deposited over IC structure 400 as shown in FIG. 52. That is, dielectric layer 446 may be conformally deposited such that dielectric layer 446 substantially surrounds fins 432 and covers dielectric layer 444 adjacent to fins 432. Nitride layer 448 may be conformally deposited such that nitride layer 448 covers dielectric layer 446 on horizontal surfaces adjacent to fins 432 and substantially surrounding fins 432. As shown, dielectric layer 446 may be formed over a vertical length of fins 432. Nitride layer 448 may be formed over dielectric layer 446 that is along the vertical length of fin 432. Together, dielectric layer 446 and nitride layer 448 substantially cover sidewalls 438, 442 of fins 432. Dielectric layer 446 and nitride layer 448 may include any of the dielectric and nitride materials discussed herein, respectively.

Figure 53:
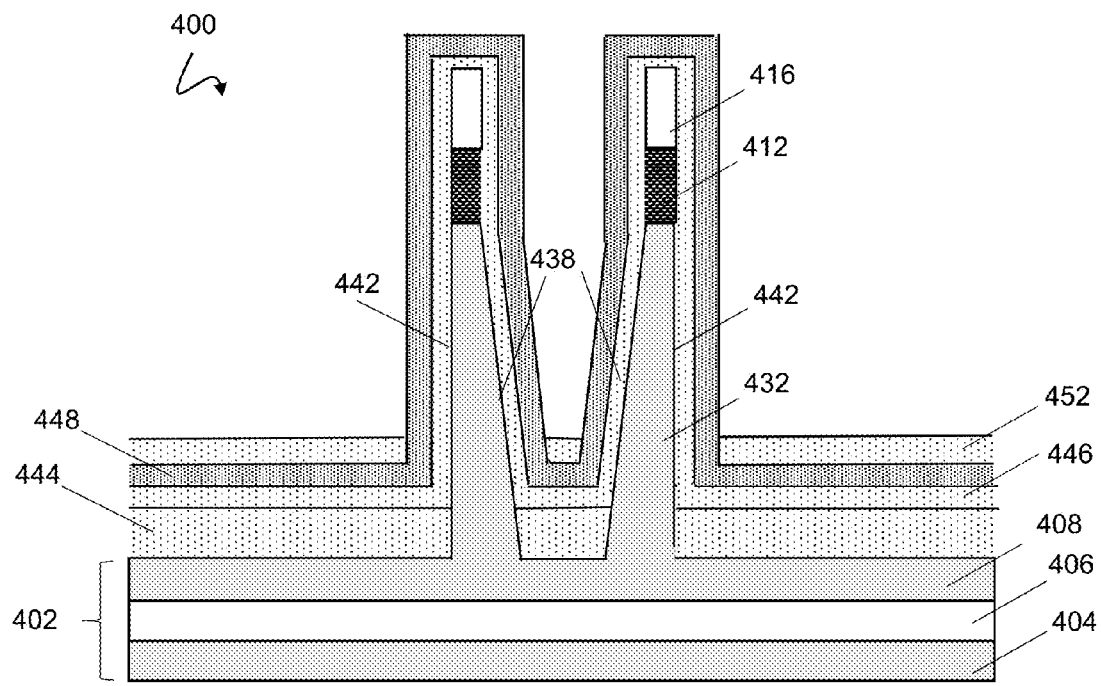
Figure 54:
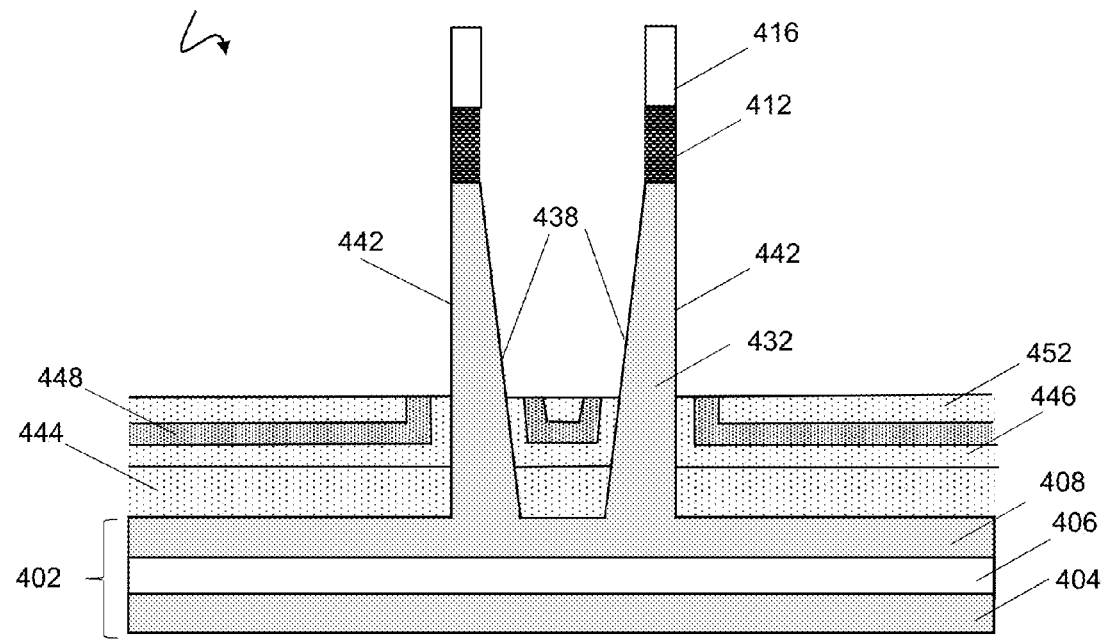

Referring now to FIG. 53, another dielectric layer 452 may be formed over horizontal surfaces of nitride layer 448 adjacent to fins 232 such that portions of nitride layer 448 positioned on vertical sidewalls of fins 432 remain substantially exposed. Dielectric layer 452 may include any of the dielectric materials discussed herein. After dielectric layer 452 is formed, dielectric layer 446 and nitride layer 448 substantially surrounding fins 432 may be selectively removed, e.g., via etching, to a top surface of dielectric layer 452 on horizontal surfaces adjacent to fins 432 as shown in FIG. 54. That is, dielectric layer 446 and nitride layer 448 may be etched such that sidewalls 438, 442 of fins 432, hard mask 412 and spacers 416 are substantially exposed.

Figure 55:
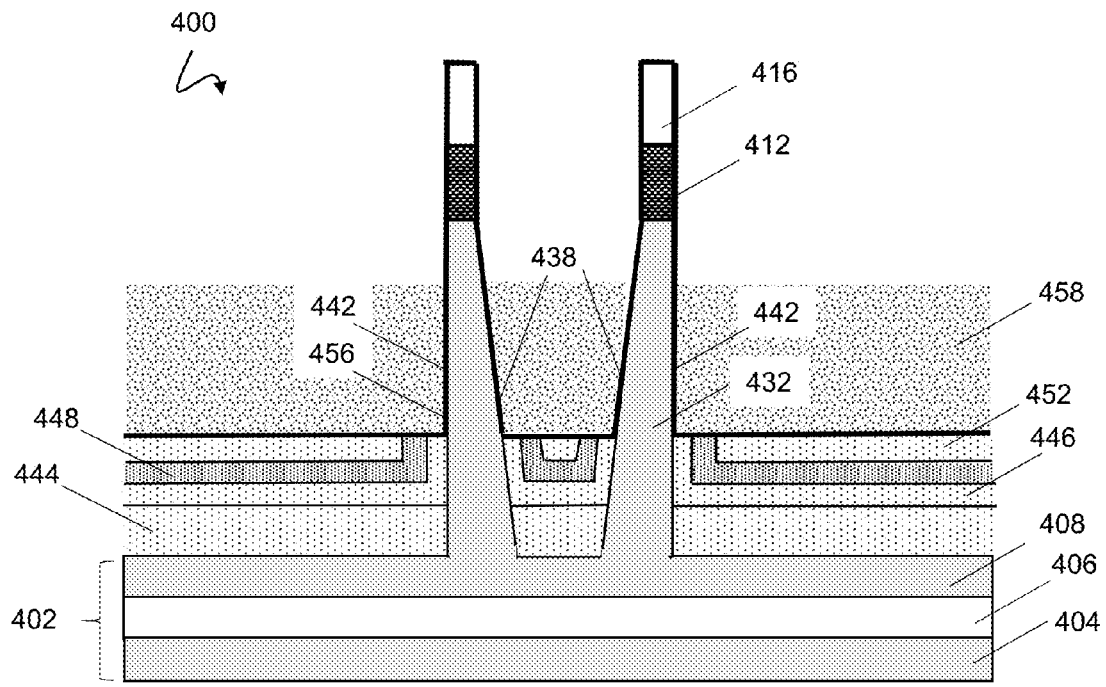

As shown in FIG. 55, a gate dielectric 456 (illustrated with dark lines) may be formed. Gate dielectric 456 may be conformally deposited such that it substantially surrounds fins 432 and lines dielectric layer 452 on horizontal surfaces adjacent to fins 432. Gate dielectric 456 may include any of the gate dielectric materials discussed herein. Further, a gate structure 458 may be formed, e.g., deposited, over horizontal surfaces of gate dielectric 456 and substantially surround fins 432. Gate structure 458 may include any of the gate structure materials discussed herein. That is, in some embodiments, gate structure 458 may include an active gate structure material. In other embodiments, gate structure 458 may include a dummy gate structure material.

Figure 56:
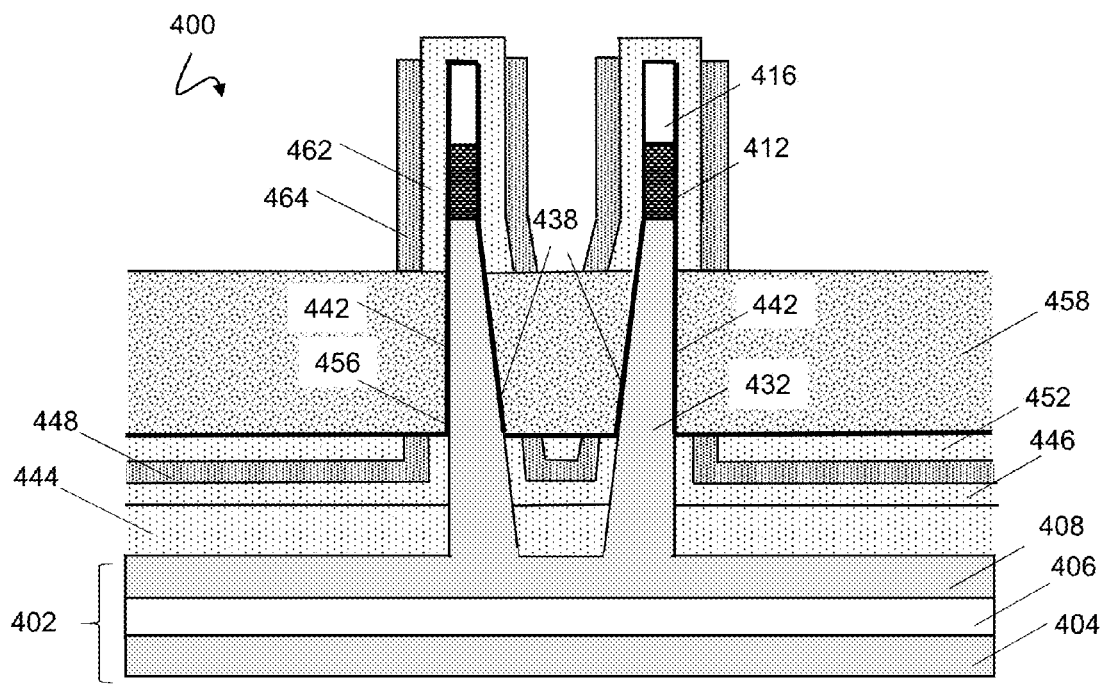

Turning to FIG. 56, another dielectric layer 462 and gate spacers 464 may be formed. Dielectric layer 462 may include any of the dielectric layer materials discussed herein. Dielectric layer 462 may be deposited and etched such that dielectric layer 462 is disposed on gate structure 458 and substantially surrounds exposed gate dielectric 456 that surrounds hard mask 412 and spacers 416 over fins 432. Further, a gate spacer material may be deposited over gate structure 458 and etched such that gate spacers 464 are formed adjacent to dielectric layer 462.

Figure 57:
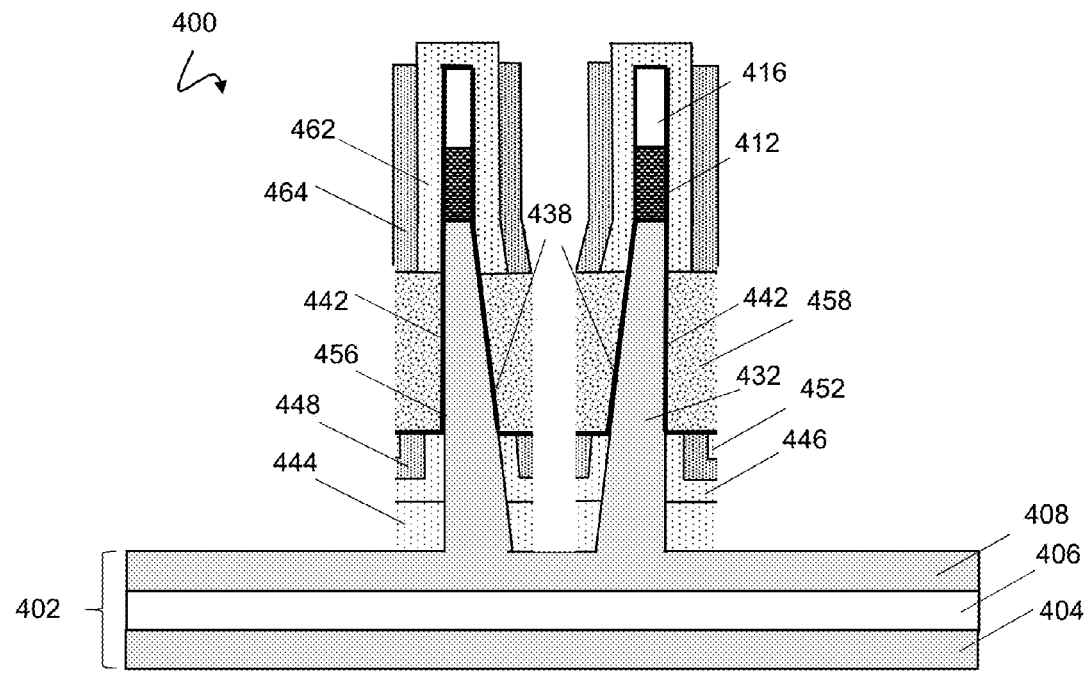

As shown in FIG. 57, an etching of IC structure 400 may be performed using gate spacers 464 and dielectric layer 462 as a mask. This etching results in the removal of portions of dielectric layers 444, 446, 452, nitride layer 448, gate dielectric 456, and gate structure 458, that are not covered or protected by gate spacers 464. That is, the etching may be performed to expose semiconductor layer 408 beneath portions of any material that is not protected or covered by gate spacers 464.

Figure 58:
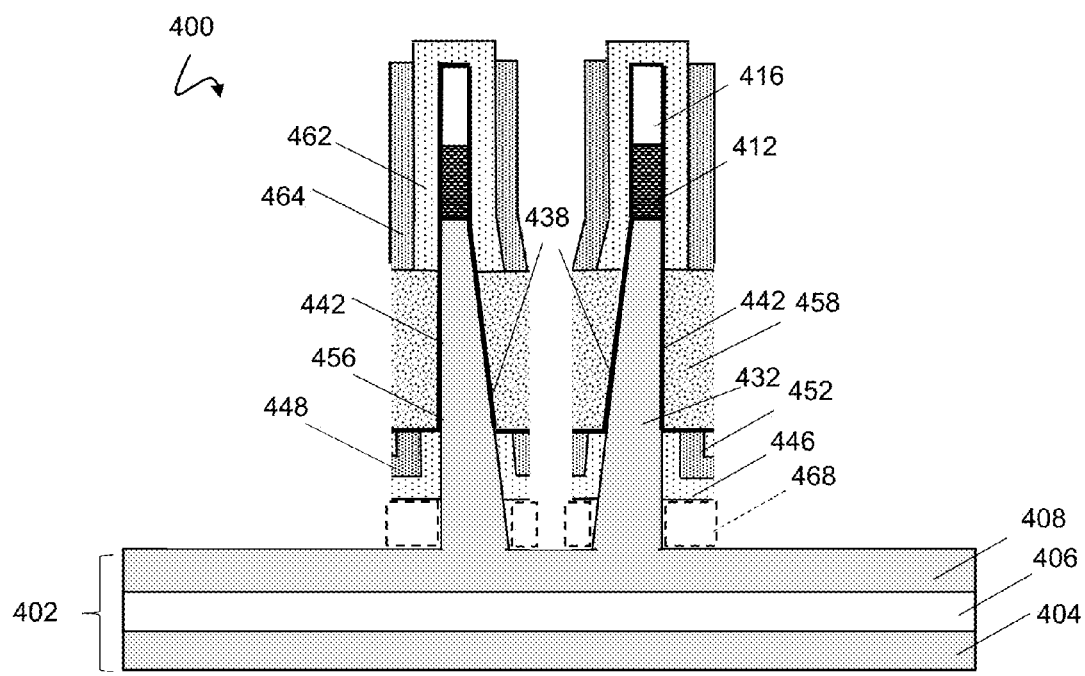
Figure 59:
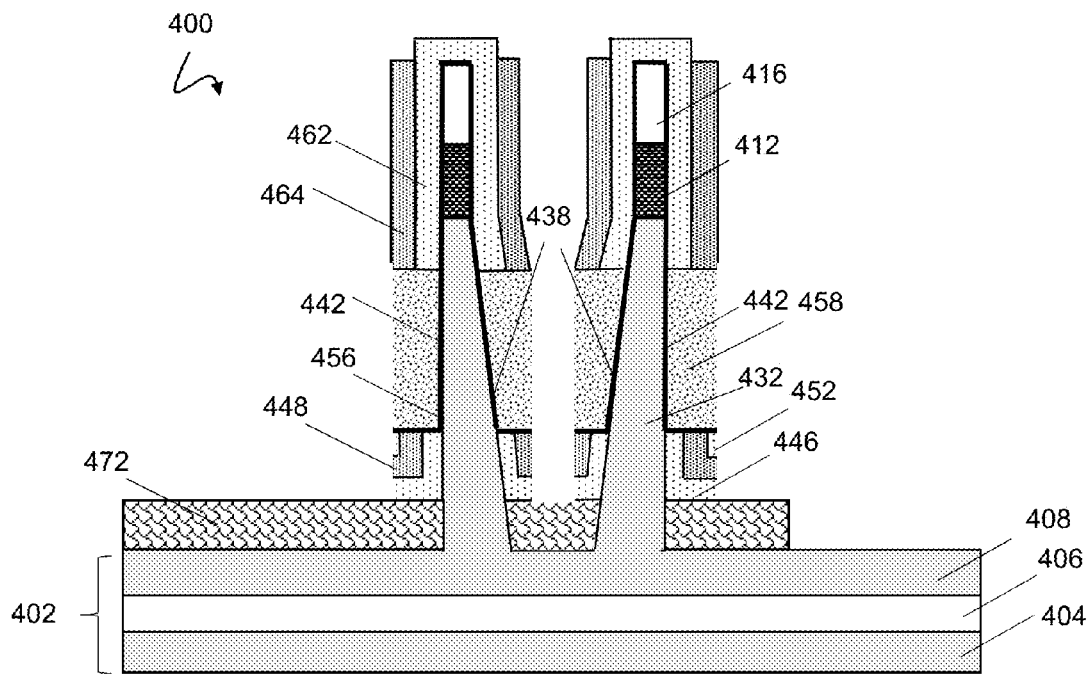

Referring now to FIG. 58, dielectric layer 444 may be completely removed. Dielectric layer 444 may be selectively etched, e.g., via isotropic etching, to expose a portion of fin 432. The removal of dielectric layer 444 may create voids 468 between dielectric layer 446 and semiconductor layer 408 adjacent to fins 432. Voids 468 may be substantially filled by forming epitaxial layer 472 within voids 468 over semiconductor layer 408 and beneath dielectric layer 446 as shown in FIG. 59. That is, epitaxial layer 472 may be grown from an exposed portion of fins 432 within voids 468 over substrate 102 and below gate structure 458. Epitaxial layer 472 may include any of the epitaxial layer materials discussed herein. Epitaxial layer 472 may be optionally patterned to any desired configuration such that a portion of substrate 402 is exposed.

Figure 60:
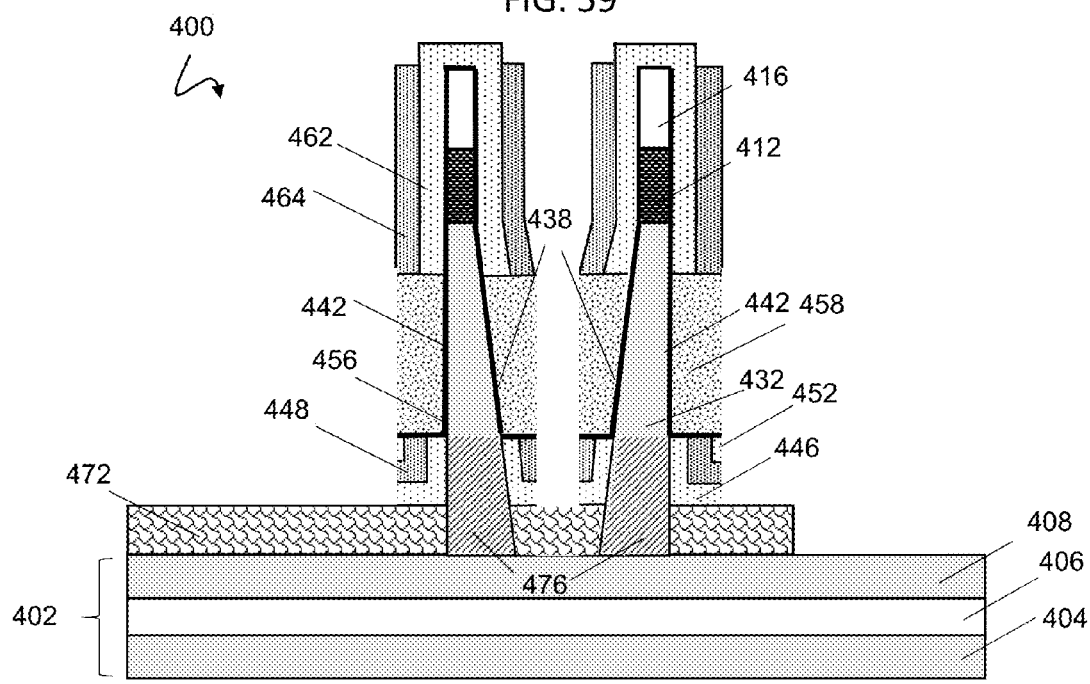
Figure 61:
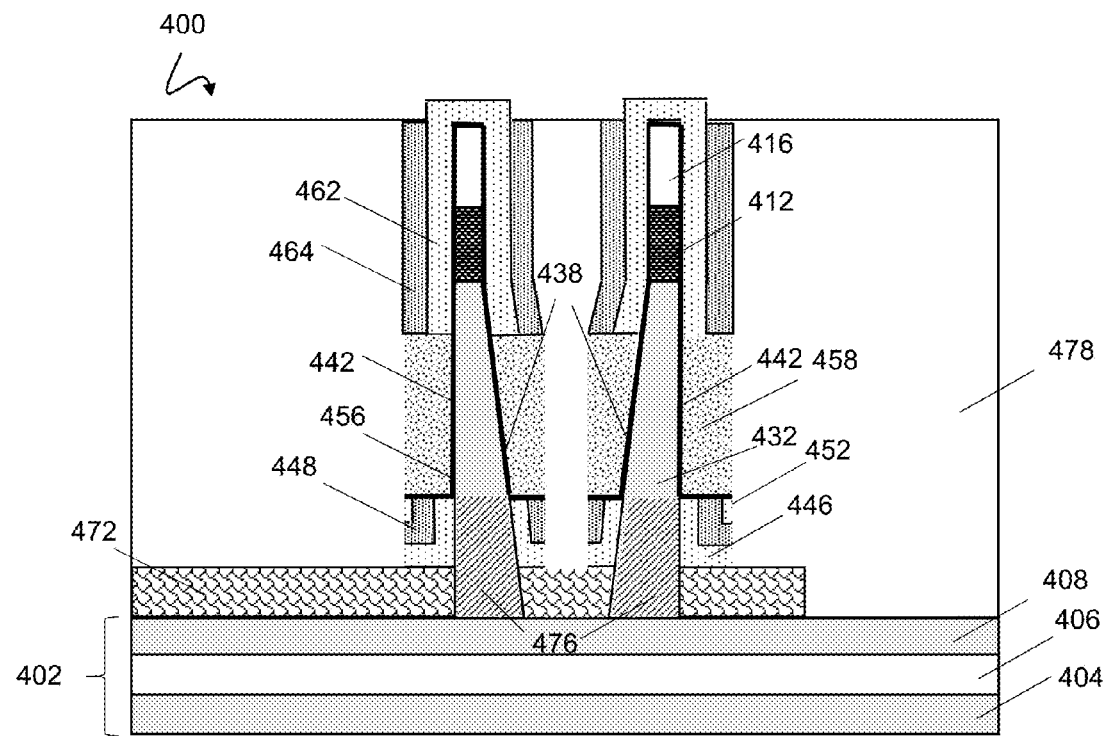

As shown in FIG. 60, epitaxial layer 472 can be annealed to diffuse the composition thereof into a portion of fins 432 adjacent to epitaxial layer 472. The annealing of epitaxial layer 472 may be performed such that epitaxial layer 472 diffuses to a point at about gate dielectric 456. The annealing and resulting diffusion can cause a source/drain region 476 to be formed within fins 432. Referring now to FIG. 61, an ILD layer 478 may be formed on IC structure 400. ILD layer 478 may be etched back or planarized to a top surface of gate spacers 264 such that a portion of oxide layer 462 is exposed. ILD layer 478 may include any of the ILD materials discussed herein.

Figure 62:
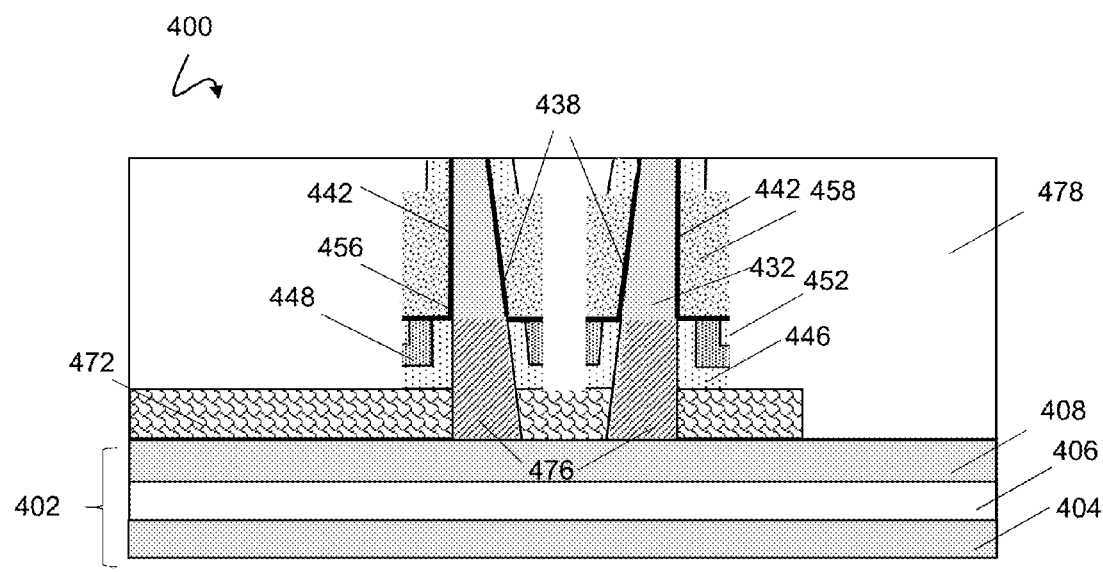
Figure 63:
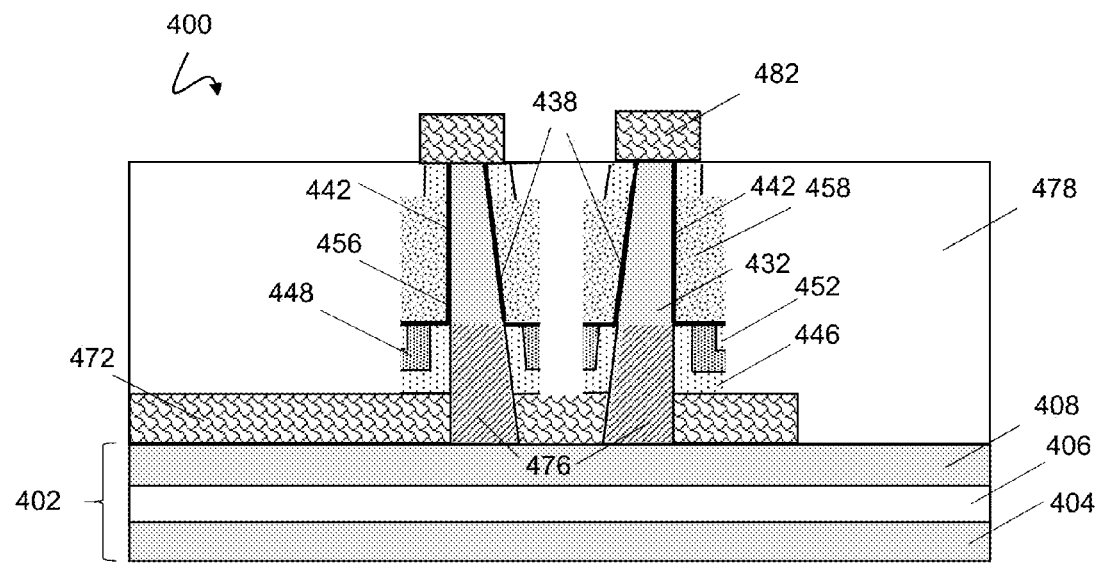

Referring now to FIG. 62, an etching may be performed to expose a top surface of fins 432. As shown, this etching may include removing portions of hard mask 412, spacers 416, dielectric layer 462, and gate spacers 464. In some embodiments (shown), it may be desirable to completely remove spacers 464 while leaving a portion of dielectric layer 462 adjacent to fins 432 above gate structure 458. Further, additional amounts of ILD layer 478 may be formed such that ILD layer 478 replaces portions of spacers 464 that were adjacent to fins 432 above gate structure 458. After the top surface of fins 432 are exposed, an epitaxial layer 482 may be formed such that epitaxial layer 482 contacts the top surface of fins 432 as shown in FIG. 63. Epitaxial layer 482 may include any of the materials listed herein. Epitaxial layer may 482 be patterned and etched to any desirable configuration to optionally expose portions of ILD layer 478.

Figure 64:
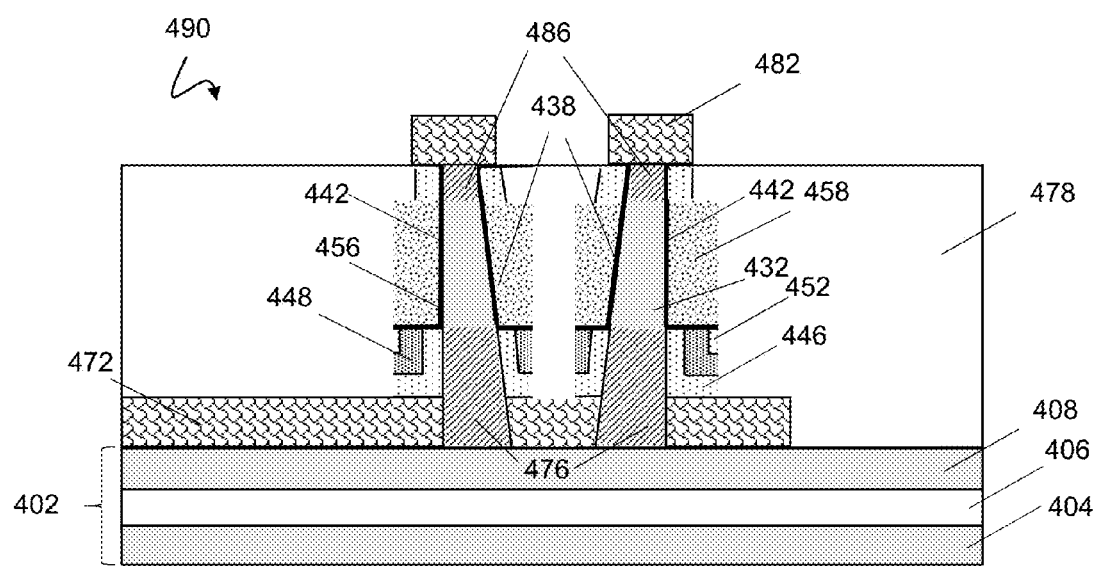

Referring now to FIG. 64, another anneal may be performed such that epitaxial layer 472 diffuses into a portion of fins 432 that is adjacent to epitaxial layer 482. The annealing may be performed such that epitaxial layer 482 diffuses to a point proximal to gate structure 458. The diffusion causes a source/drain region 486 to be formed within fins 432.

The resulting IC structure shown in FIG. 64 may embody a vertical transistor 490. Vertical transistor 490 may include fins 432, e.g., at least a pair of fins, having source/drain region 476 and source/drain region 486. Source/drain region 476 may be over substrate 402 and below gate structure 458, and source/drain region 486 may be within ILD layer 478 and over gate structure 458. That is, gate structure 458 may be disposed within ILD layer 478 between source/drain region 476 and source/drain region 486. Additionally, gate structure 458 may substantially surround fins 432. Vertical transistor 490 may also include epitaxial layer 472 over substrate 402 within ILD layer 478 and substantially surrounding source/drain region 476. Further, epitaxial layer 482 may be disposed over source/drain region 486 and over ILD layer 478. Dielectric layer 446 may be disposed over at least a portion of epitaxial layer 472 in an area between epitaxial layer 472 and gate structure 458. Dielectric layer 446 may surround source/drain region 476. Within the same area, nitride layer 448 may be disposed over a portion of dielectric layer 446 and dielectric layer 452 may be disposed over a portion of nitride layer 448. Gate dielectric 456 may substantially separate dielectric layers 446, 452 and nitride layer 448 from gate structure 458. Additionally, gate dielectric 456 may separate gate structure 458 from fins 432. Within an area above gate structure 458 and beneath epitaxial layer 482 within ILD layer 478, dielectric layer 476 may be disposed adjacent to source/drain region 486, and in addition may substantially surround source/drain region 486.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A vertical transistor comprising:
 a fin having a first source/drain region and a second source/drain, the first source/drain region being over a substrate and below a central region of the fin, and the second source/drain region being within an inter-level dielectric (ILD) layer and over the central region of the fin; and
 a gate structure within the dielectric layer substantially surrounding the central region of the fin between the first source/drain region and the second source/drain region,
 wherein the fin includes at least one tapered region from the central region of the fin to at least one of the first source/drain region or the second source/drain region.

2. The vertical transistor of claim 1, wherein the at least one tapered region includes a first tapered region to the first source/drain region and a second tapered region to the second source/drain region.

3. The vertical transistor of claim 1, further comprising:
 a first epitaxial layer over the substrate within the ILD layer and substantially surrounding the first source/drain region; and
 a second epitaxial layer over the ILD layer and over the second source/drain region.

4. The vertical transistor of claim 3, further comprising a dielectric layer positioned between the first epitaxial layer and the gate structure.

5. The vertical transistor of claim 3, further comprising a nitride layer positioned between the gate structure and the second epitaxial layer.

6. The vertical transistor of claim 2, further comprising a gate spacer substantially surrounding the gate structure.

7. The vertical transistor of claim 2, further comprising, within an area between the first epitaxial layer and the gate structure:
 a dielectric layer over the first epitaxial layer;
 a nitride layer over the dielectric layer; and
 a second dielectric layer over the nitride layer.

* * * * *